United States Patent
Shrivastava et al.

(10) Patent No.: US 12,542,549 B2
(45) Date of Patent: Feb. 3, 2026

(54) GATE RESISTOR BYPASS FOR RF FET SWITCH STACK

(71) Applicant: pSemi Corporation, San Diego, CA (US)

(72) Inventors: Ravindranath D. Shrivastava, San Diego, CA (US); Fleming Lam, San Diego, CA (US); Payman Shanjani, San Diego, CA (US)

(73) Assignee: pSemi Corporation

( * ) Notice: Subject to any disclaimer, the term of this patent is extended or adjusted under 35 U.S.C. 154(b) by 0 days.

(21) Appl. No.: 18/427,598

(22) Filed: Jan. 30, 2024

(65) Prior Publication Data

US 2024/0171170 A1 May 23, 2024

Related U.S. Application Data

(63) Continuation of application No. PCT/US2022/034581, filed on Jun. 22, 2022, which
(Continued)

(51) Int. Cl.
*H03K 17/04* (2006.01)
*H03K 17/041* (2006.01)
(Continued)

(52) U.S. Cl.
CPC ..... *H03K 17/04123* (2013.01); *H03K 17/102* (2013.01)

(58) Field of Classification Search
None
See application file for complete search history.

(56) References Cited

U.S. PATENT DOCUMENTS 5,274,276 A 12/1993 Casper et al.
7,910,993 B2 3/2011 Brindle et al.
(Continued)

FOREIGN PATENT DOCUMENTS

CN 117296250 A 12/2023
CN 117795854 A 3/2024
(Continued)

OTHER PUBLICATIONS

International Preliminary Report on Patentability for International application No. PCT/US2022/077067 filed on Sep. 27, 2022. Mailed on Apr. 11, 2024. 6 pages.
(Continued)

*Primary Examiner* — Kenneth B Wells
(74) *Attorney, Agent, or Firm* — Haynes and Boone, LLP

(57) ABSTRACT

A common gate resistor bypass arrangement for a stacked arrangement of FET switches, the arrangement including a series combination of an nMOS transistor and a pMOS transistor connected across a common gate resistor. During at least a transition portion of the transition state of the stacked arrangement of FET switches, the nMOS transistor and the pMOS transistor are both in an ON state and bypass the common gate resistor. On the other hand, during at least a steady state portion of the ON steady state and the OFF steady state of the stacked arrangement of FET switches, one of the nMOS transistor and the pMOS transistor is in an OFF state and the other of the nMOS transistor and the pMOS transistor is in an ON state, thus not bypassing the common gate resistor.

24 Claims, 17 Drawing Sheets

Related U.S. Application Data is a continuation of application No. 17/403,758, filed on Aug. 16, 2021, now Pat. No. 11,405,031.

(51) Int. Cl.
  *H03K 17/0412* (2006.01)
  *H03K 17/10* (2006.01)
  *H03K 17/16* (2006.01)
  *H03K 17/687* (2006.01)

(56) References Cited

U.S. PATENT DOCUMENTS

| | | | |
|---|---|---|---|
| 8,405,147 | B2 | 3/2013 | Brindle et al. |
| 9,143,124 | B2 | 9/2015 | Cam et al. |
| 9,184,731 | B2 | 11/2015 | Lam |
| 9,893,722 | B2 | 2/2018 | Mokalla |
| 9,941,347 | B2 | 4/2018 | Shapiro et al. |
| 10,236,872 | B1 | 3/2019 | Willard et al. |
| 10,396,772 | B2 | 8/2019 | Shanjani et al. |
| 10,454,529 | B2 | 10/2019 | Kerr |
| 10,461,729 | B2 | 10/2019 | Kerr et al. |
| 10,608,623 | B2 | 3/2020 | Kerr et al. |
| 10,763,842 | B1 | 9/2020 | Dai |
| 10,886,911 | B2 | 1/2021 | Willard et al. |
| 10,897,246 | B2 | 1/2021 | Scott et al. |
| 11,290,001 | B2 | 3/2022 | Zhang et al. |
| 11,405,031 | B1 | 8/2022 | Shrivastava et al. |
| 11,405,034 | B1 | 8/2022 | Shapiro et al. |
| 11,405,035 | B1 | 8/2022 | Genc et al. |
| 11,632,107 | B1 | 4/2023 | Shrivastava et al. |
| 11,671,135 | B2 | 6/2023 | Shrivastava et al. |
| 12,081,210 | B2 | 9/2024 | Shapiro et al. |
| 12,119,814 | B2 | 10/2024 | Shrivastava et al. |
| 2003/0090313 | A1 | 5/2003 | Burgener et al. |
| 2007/0186152 | A1 | 8/2007 | Gurcan et al. |
| 2010/0013541 | A1 | 1/2010 | Balboni |
| 2010/0176783 | A1 | 7/2010 | Tagome |
| 2013/0033307 | A1 | 2/2013 | Lin |
| 2013/0115895 | A1 | 5/2013 | Crandall |
| 2016/0104077 | A1 | 4/2016 | Jackson, Jr. et al. |
| 2016/0329891 | A1 | 11/2016 | Bakalski et al. |
| 2017/0272066 | A1* | 9/2017 | Scott .................. H03K 17/161 |
| 2017/0302259 | A1 | 10/2017 | Mokalla |
| 2018/0048273 | A1 | 2/2018 | Goldblatt |
| 2018/0167062 | A1 | 6/2018 | Shanjani et al. |
| 2018/0175851 | A1 | 6/2018 | Kerr et al. |
| 2019/0206863 | A1 | 7/2019 | Blin et al. |
| 2019/0305768 | A1 | 10/2019 | Willard et al. |
| 2020/0244226 | A1 | 7/2020 | Klaren et al. |
| 2020/0266778 | A1 | 8/2020 | Ayranci et al. |
| 2021/0075420 | A1 | 3/2021 | Kovac et al. |
| 2021/0167773 | A1 | 6/2021 | Burgener et al. |
| 2022/0038098 | A1 | 2/2022 | Malladi |
| 2023/0105033 | A1 | 4/2023 | Shrivastava et al. |
| 2023/0107974 | A1 | 4/2023 | Shrivastava et al. |
| 2023/0238952 | A1* | 7/2023 | Syroiezhin ....... H03K 17/04206 327/427 |
| 2023/0283277 | A1 | 9/2023 | Shrivastava et al. |
| 2023/0396244 | A1* | 12/2023 | Slaton .............. H03K 17/04123 |
| 2024/0063789 | A1 | 2/2024 | Shapiro et al. |
| 2024/0146301 | A1 | 5/2024 | Genc et al. |
| 2024/0259044 | A1 | 8/2024 | Shrivastava et al. |
| 2024/0405771 | A1 | 12/2024 | Shapiro et al. |
| 2024/0429918 | A1 | 12/2024 | Shrivastava et al. |

FOREIGN PATENT DOCUMENTS

| | | | |
|---|---|---|---|
| CN | 118044119 | A | 5/2024 |
| CN | 118077148 | A | 5/2024 |
| DE | 112022002605 | T5 | 2/2024 |
| DE | 112022004739 | T5 | 7/2024 |
| DE | 112022004742 | T5 | 7/2024 |
| EP | 1536327 | A2 | 6/2005 |
| EP | 3484049 | A1 | 5/2019 |
| KR | 100970374 | B1 | 7/2010 |
| KR | 20160131926 | A | 11/2016 |
| KR | 20170038223 | A | 4/2017 |
| WO | 2013/017696 | A1 | 2/2013 |
| WO | 2022/241147 | A1 | 11/2022 |
| WO | 2023/287560 | A1 | 1/2023 |
| WO | 2023/022792 | A1 | 2/2023 |
| WO | 2023/056242 | A1 | 4/2023 |
| WO | 2023/056244 | A1 | 4/2023 |

OTHER PUBLICATIONS

International Preliminary Report on Patentability for International PCT Application No. PCT/US2022/077069 filed on Sep. 27, 2022, on behalf of pSemi Corporation, Mailed on Apr. 11, 2024. 7 Pages.
International Preliminary Report on Patentability issued for International application No. PCT/US2022/034581 filed on Jun. 22, 2022. Mailed on Feb. 29, 2024. 15 pages.
Non-Final Office Action for U.S. Appl. No. 18/183,806, filed Mar. 14, 2023 on behalf of pSemi Corporation. Mailed on May 22, 2024. 13 pages.
Non-Final Office Action issued for U.S. Appl. No. 18/473,742, filed Sep. 25, 2023, on behalf of pSemi Corporation, Mail Date: Apr. 5, 2024, 17 Pages.
Notice of Allowance for U.S. Appl. No. 18/473,742, filed Sep. 25, 2023, on behalf of pSemi Corporation. Mail Date: May 6, 2024. 9 Pages.
Notice of Allowance for U.S. Appl. No. 18/183,806, filed Mar. 14, 2023 on behalf of pSemi Corporation. Mailed on Aug. 7, 2024. 7 pages.
Notice of Allowance for U.S. Appl. No. 18/183,806, filed Mar. 14, 2023 on behalf of pSemi Corporation. Mailed on Jun. 12, 2024. 5 pages.
Corrected Notice of Allowability issued by the USPTO for U.S. Appl. No. 17/492,180, filed Oct. 1, 2021. Mailing date Feb. 10, 2023. 3 pages.
Final Office Action for U.S. Appl. No. 17/321,363, filed May 14, 2021 on behalf of Psemi Corporation Mail Date: Mar. 15, 2022 15 pages.
International Preliminary Report on Patentability for International PCT Application No. PCT/US2022/029042 filed on May 12, 2022, on behalf of pSemi Corporation, Mail Date: Nov. 23, 2023.
International Preliminary Report on Patentability for International PCT Application No. PCT/US2022/034580 filed on Jun. 22, 2022, on behalf of pSemi Corporation, Mail Date: Jan. 25, 2024. 9 pages.
International Search Report and Written Opinion for International application No. PCT/US2022/029042 filed on May 12, 2022. Mailed on Sep. 6, 2022. 9 pages.
International Search Report and Written Opinion for International application No. PCT/US2022/034581 filed on Jun. 22, 2022. Mailed on Oct. 11, 2022. 17 pages.
International Search Report and Written Opinion for International application No. PCT/US2022/077067 filed on Sep. 27, 2022. Mailed on Jan. 26, 2023. 9 pages.
International Search Report and Written Opinion for International PCT Application No. PCT/US2022/034580 filed on Jun. 22, 2022, on behalf of pSemi Corporation, Mail Date: Jan. 19, 2023, 10 pages.
International Search Report and Written Opinion for International PCT Application No. PCT/US2022/077069 filed on Sep. 27, 2022, on behalf of pSemi Corporation, Mailed on Jan. 20, 2023, 11 Pages.
International Search Report and Written Opinion for PCT/US2022/029042 filed on May 12, 2022 on behalf of pSemi Corporation Mail Date: Sep. 6, 2022 11 pages.
International Search Report and Written Opinion for International PCT Application No. PCT/US2022/034580 filed on Jun. 22, 2022, on behalf of pSemi Corporation, Mail Date: Oct. 11, 2022, 10 Pages.
ISR & Written Opinion issued by the EPO for PCT/US2022/034581 with a mailing date of Oct. 11, 2022, 17 pages.
Non-Final Office Action for U.S. Appl. No. 17/321,363, filed May 14, 2021, on behalf of pSemi Corporation. Mail Date: Sep. 15, 2021. 14 Pages.

(56) References Cited

OTHER PUBLICATIONS

Non-Final Office Action for U.S. Appl. No. 17/374,927, filed Jul. 13, 2021 on behalf of pSemi Corporation Mail Date: Apr. 14, 2022 9 pages.
Non-Final Office Action for U.S. Appl. No. 17/492, 180 filed on Oct. 1, 2021 on behalf of pSemi Corporation, Mail Date: Aug. 2, 2022, 18 pages.
Notice of Allowance for U.S. Appl. No. 17/492,199, filed Oct. 1, 2021, on behalf of pSemi Corporation, Mailed Date: Feb. 9, 2023, 12 pages.
Notice of Allowance for U.S. Appl. No. 17/321,363, filed May 14, 2021, on behalf of pSemi Corporation. Mail Date: Apr. 28, 2022. 8 Pages.
Notice of Allowance for U.S. Appl. No. 17/403,758, filed Aug. 16, 2021, on behalf of pSemi Corporation. Mail Date: May 25, 2022. 9 Pages.
Notice of Allowance for U.S. Appl. No. 17/492,180, filed Oct. 1, 2021, on behalf of pSemi Corporation. Mail Date: Dec. 19, 2022. 7 Pages.
Notice of Allowance U.S. Appl. No. 17/374,927, filed Jul. 13, 2021, on behalf of pSemi Corporation. Mail Date: May 11, 2022. 8 Pages.
Supplemental Notice of Allowance for U.S. Appl. No. 17/492,199, filed Oct. 1, 2021, on behalf of pSemi Corporation, Mailed Date: Feb. 28, 2023, 3 pages.

\* cited by examiner

GATE RESISTOR BYPASS FOR RF FET SWITCH STACK

CROSS-REFERENCE TO RELATED APPLICATIONS

The present application is a continuation of International Patent Application No. PCT/US2022/034581, filed on Jun. 22, 2022, which, in turn, is a continuation of U.S. patent application Ser. No. 17/403,758, filed on Aug. 16, 2021, now U.S. Pat. No. 11,405,031, issued on Aug. 2, 2022 for "GATE RESISTOR BYPASS FOR RF FET SWITCH STACK," the contents of all of which are being incorporated herein by reference in their entirety. The present application may also be related to U.S. patent application Ser. No. 17/374,927 for a "Gate Resistor Bypass For RF FET Switch Stack," also owned by Applicant, filed on Jul. 13, 2021, now U.S. Pat. No. 11,405,035, and incorporated herein by reference in its entirety.

FIELD

The present disclosure relates to integrated circuit devices, and more particularly to methods and apparatus for reducing the switching time by bypassing the gate resistor of switching devices.

BACKGROUND

FIG. 1 shows a schematic representation of an RF switch FET stack (110) with input RFIN and output RFOUT. FET stack (110) is biased through resistor networks, such as body, drain/source and gate rail/rung resistor ladders, of which only gate resistor ladder (120) is shown in the figure, for ease of reference. FET stack (110) also includes a gate control block (130) to control the bias on the gate terminals of the FETs of the FET stack. Gate control block (130) includes one or more transition-dependent gate bias feed bypass resistors (also called dynamic resistors), as described, for example, in U.S. Pat. No. 10,396,772, incorporated herein by reference in its entirety.

SUMMARY

The present application describes a novel type of gate control block, as described in detail in the following figures. Such novel type of gate control block will be sometimes referred to as dynamic gate throughout the present disclosure.

According to a first aspect, a FET switch stack is provided, comprising: a stacked arrangement of FET switches connected at one end to an RF terminal configured to be coupled to an RF signal, the FET switch stack configured to have an ON steady state where the FET switches are ON, an OFF steady state where the FET switches are OFF and one or more transition states, the one or more transition states comprising an OFF-to-ON transition state and an ON-to-OFF transition state; a gate resistor network comprising resistors connected to gate terminals of the FET switches and one or more common gate resistors connected to the gate resistor network, the gate resistor network and the one or more common gate resistors configured to feed a gate control voltage to the gate terminals of the FET switches; and a common gate resistor bypass arrangement comprising at least one series combination of an nMOS transistor and a pMOS transistor connected across the one or more common gate resistors and configured to i) bypass the one or more common gate resistors during at least a transition portion of the one or more transition states of the stacked arrangement of FET switches, the nMOS transistor and the pMOS transistor being both in an ON state during said transition portion, and ii) not bypass the one or more common gate resistors during at least a steady state portion of the ON steady state and the OFF steady state of the stacked arrangement of FET switches, one of the nMOS transistor and the pMOS transistor being in an OFF state and the other of the nMOS transistor and the pMOS transistor being in an ON state during said steady state portion, wherein the nMOS transistor comprises an nMOS transistor gate terminal configured to transition from a first nMOS gate voltage to a second nMOS gate voltage higher than the first nMOS gate voltage during at least a first portion of the OFF-to-ON transition state and during an initial portion of the ON-to-OFF transition state; and the pMOS transistor comprises a pMOS transistor gate terminal configured to transition from a first pMOS gate voltage to a second pMOS gate voltage lower than the first pMOS gate voltage during at least a first portion of the ON-to-OFF transition state and during an initial portion of the OFF-to-ON transition state.

According to a second aspect, a FET switch stack is provided, comprising: a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa; a gate resistor network comprising resistors connected to gate terminals of the FET switches and one or more common gate resistors connected to the gate resistor network, the gate resistor network and the one or more common gate resistors configured to feed a gate control voltage to the gate terminals of the FET switches; and a common gate resistor bypass arrangement comprising at least one series combination of an nMOS transistor and a pMOS transistor connected across the one or more common gate resistors and configured to i) bypass the one or more common gate resistors during at least a transition portion of the transition state of the stacked arrangement of FET switches, the nMOS transistor and the pMOS transistor being both in an ON state during said transition portion, and ii) not to bypass the one or more common gate resistors during at least a steady state portion of the ON steady state and the OFF steady state of the stacked arrangement of FET switches, one of the nMOS transistor and the pMOS transistor being in an OFF state and the other of the nMOS transistor and the pMOS transistor being in an ON state during said steady state portion, wherein the transition state comprises an OFF-to-ON transition state and an ON-to-OFF transition state; the nMOS transistor comprises an nMOS transistor gate terminal configured to transition from a first nMOS gate voltage to a second nMOS gate voltage higher than the first nMOS gate voltage during at least a first portion of the OFF-to-ON transition state; and the pMOS transistor comprises a pMOS transistor gate terminal configured to transition from a first pMOS gate voltage to a second pMOS gate voltage lower than the first pMOS gate voltage during at least a first portion of the ON-to-OFF transition state; the nMOS transistor gate terminal is further configured to transition from the second nMOS gate voltage to a third nMOS gate voltage higher than the second nMOS gate voltage during a second portion of the OFF-to-ON transition state following the at least first portion of the OFF-to-ON transition state; and the pMOS transistor gate terminal is further configured to transition from the second pMOS gate voltage to a third pMOS gate voltage lower than the second pMOS gate voltage during a second portion of the ON-to-OFF transition state following the at least first portion of the ON-to-OFF transition state.

According a to a third aspect, a FET switch stack is provided, comprising: a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa; a gate resistor network comprising resistors connected to gate terminals of the FET switches and one or more common gate resistors connected to the gate resistor network, the gate resistor network and the one or more common gate resistors configured to feed a gate control voltage to the gate terminals of the FET switches; and a common gate resistor bypass arrangement comprising at least one series combination of an nMOS transistor and a pMOS transistor connected across the one or more common gate resistors and configured to i) bypass the one or more common gate resistors during at least a transition portion of the transition state of the stacked arrangement of FET switches, the nMOS transistor and the pMOS transistor being both in an ON state during said transition portion, and ii) not bypass the one or more common gate resistors during at least a steady state portion of the ON steady state and the OFF steady state of the stacked arrangement of FET switches, one of the nMOS transistor and the pMOS transistor being in an OFF state and the other of the nMOS transistor and the pMOS transistor being in an ON state during said steady state portion, wherein the transition state comprises an OFF-to-ON transition state and an ON-to-OFF transition state; the nMOS transistor comprises an nMOS transistor gate terminal configured to transition from a first nMOS gate voltage to a second nMOS gate voltage higher than the first nMOS gate voltage during at least a first portion of the OFF-to-ON transition state; and the pMOS transistor comprises a pMOS transistor gate terminal configured to transition from a first pMOS gate voltage to a second pMOS gate voltage lower than the first pMOS gate voltage during at least a first portion of the ON-to-OFF transition state; the gate control voltage is configured to transition from a first gate control voltage to a second gate control voltage higher than the first gate control voltage during the first portion of the OFF-to-ON transition state and to a third gate control voltage higher than the second gate control voltage during a second portion of the OFF-to-ON transition state following the first portion of the OFF-to-ON transition state; and the gate control voltage is configured to transition from a fourth gate control voltage to a fifth gate control voltage lower than the fourth gate control voltage during the first portion of the ON-to-OFF transition state and to a sixth gate control voltage lower than the fifth gate control voltage during a second portion of the ON-to-OFF transition state following the first portion of the ON-to-OFF transition state.

According to a fourth aspect, a method to controllably bypass a resistor across a series combination of an nMOS transistor and a pMOS transistor is provided, the series combination and the resistor configured to receive a control signal switching from a first static state to a second static state and vice versa, and output the control signal to control ON and OFF status of an RF FET switch, the method comprising: in the first static state of the control signal, setting a gate terminal of the nMOS transistor at a first nMOS gate voltage and a gate terminal of the pMOS transistor at a first pMOS gate voltage, the first nMOS gate voltage selected to set the nMOS transistor in an ON state and the first pMOS gate voltage selected to set the pMOS transistor in an OFF state, the ON state of the nMOS transistor and the OFF state of the pMOS transistor establishing a high impedance status of the series combination and not bypassing the resistor when feeding the control signal to the RF FET switch; during a transition of the control signal from the first state to the second state, for at least a first portion of the transition, the gate terminal of the nMOS transistor with a second nMOS gate voltage higher than the first nMOS gate voltage, thereby keeping the nMOS transistor in the ON state, and feeding, during an initial portion of the transition, the gate terminal of the pMOS transistor with a second pMOS gate voltage lower than the first pMOS gate voltage and keeping, for a remaining part of the transition, the gate terminal of the pMOS transistor at the first pMOS gate voltage, thereby setting the pMOS transistor in an ON state during the transition, the ON state of the nMOS transistor and the ON state of the pMOS transistor establishing a low impedance status of the series combination and bypassing the resistor when feeding the control signal to the RF FET switch; and in the second static state of the control signal, keeping the gate terminal of the pMOS transistor at the first pMOS gate voltage, thereby keeping the pMOS transistor in the ON state, and feeding the gate terminal of the nMOS transistor with the first nMOS gate voltage, thus setting the nMOS transistor in an OFF state, the OFF state of the nMOS transistor and the ON state of the pMOS transistor re-establishing a high impedance status of the series combination and not bypassing the resistor when feeding the control signal to the RF FET switch.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
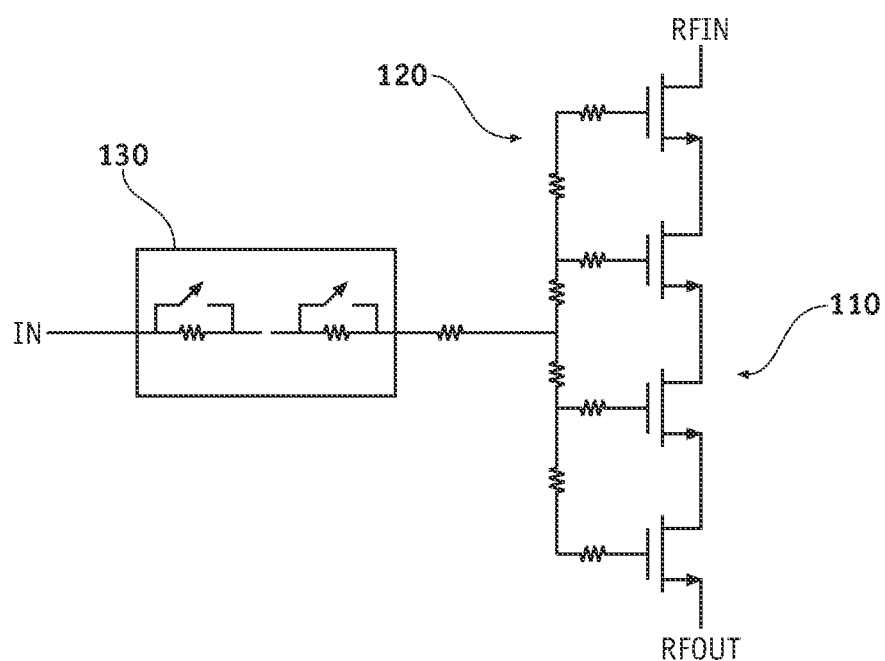
FIG. 1 shows a prior art FET switch with a gate resistor bypass.
Figure 2A:
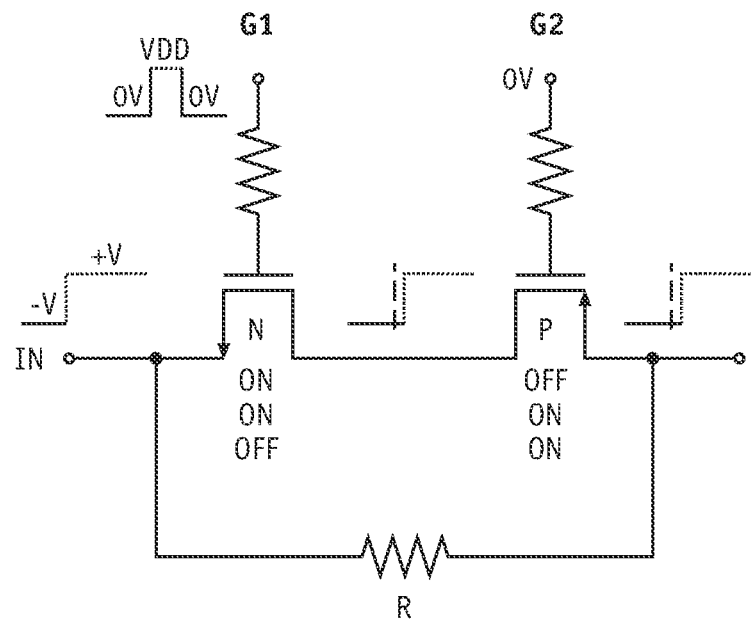
FIGS. 2A-2B show a schematic diagram of an embodiment of the dynamic gate according to the present disclosure, including a series combination of an nMOS transistor and a pMOS transistor.
Figure 2B:
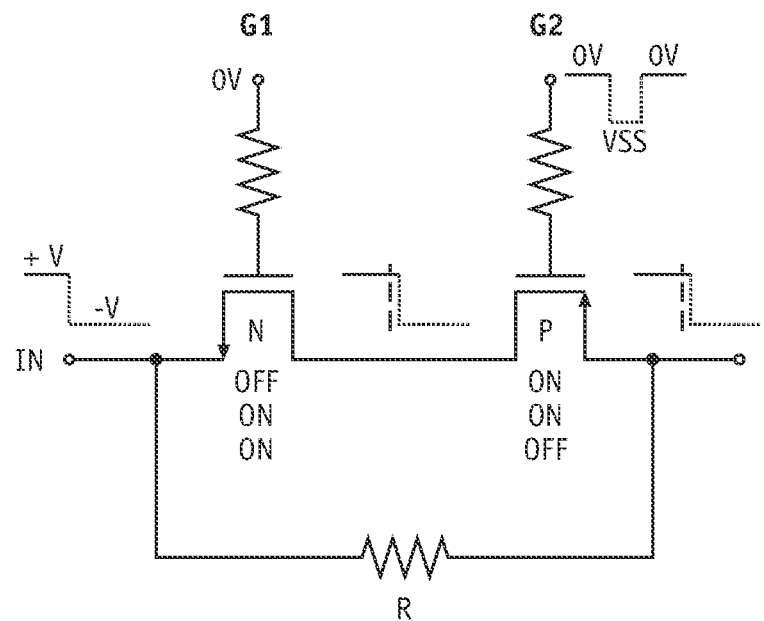

FIGS. 2A and 2B show a schematic diagram of an embodiment of a novel gate control block in accordance to the present disclosure, including a series combination of an nMOS transistor and a pMOS transistor across a resistor R. The dynamic gate is configured to receive the voltage input signal IN (i.e. the signal that controls the switching status of the main RF switch (110) of FIG. 1 at the gate of each transistor of the RF switch) at the source of the nMOS transistor and feed the signal to the RF switch (110) through the gate resistive ladder (120) of FIG. 1 coupled to the source of the pMOS transistor on the right side of FIGS. 2A and 2B.

The input signal IN transitions from a first, high, static state (called VDD, +V or V+ throughout the present disclosure, e.g. +4V) to a second, low, static state (called VSS, −V or V− throughout the present disclosure, e.g. −3.4V) and vice versa. FIG. 2A shows behavior of the dynamic gate when the input signal IN transitions from V− to V+, while FIG. 2B shows behavior of the dynamic gate when the input signal IN transitions from V+ to V−.

With reference to FIG. 2A, in the static condition IN=−V, the gate terminals G1 and G2 of the nMOS transistor and the pMOS transistor, respectively, are at 0V. The source terminal of the nMOS transistor sees a negative signal, therefore keeping the nMOS transistor in ON state. The potential of the internal node between the nMOS transistor and the pMOS transistor will be forced to about −V by the drain voltage of the nMOS transistor. On the other hand, given that also the source terminal of the pMOS transistor sees a negative signal (through R), the pMOS transistor will be in an OFF state. These conditions are graphically represented in FIG. 2A by the upper wording "ON" right under the nMOS transistor and the upper wording "OFF" right under the pMOS transistor. In this static condition, the resistor is not bypassed and the input signal IN is fed to the gates of the transistors of the main RF switch through resistor R (high impedance status).

With continued reference to FIG. 2A, when the input signal IN begins to transition from −V to +V, the pMOS transistor soon exits the OFF state and goes into an ON state. The ON state of the pMOS transistor during the transition is being graphically represented in FIG. 2A by the middle wording "ON" under the pMOS transistor. On the other hand, the gate voltage of the nMOS transistor starts receiving a positive (e.g. VDD) pulse during or within a portion of the transition time window, as also shown by the square pulse representation close to gate G1 in FIG. 2A. The presence of the positive pulse on the gate G1 of the nMOS transistor while the voltage IN on its source transitions from −V to +V allows the nMOS transistor to stay ON during or within a portion of the transition time window. The ON state of the nMOS transistor during the transition is being graphically represented in FIG. 2A by the middle wording "ON" under the nMOS transistor.

As a consequence, there will be a time interval inside the V− to V+ transition, having the duration of the transition or a portion thereof, where both the nMOS transistor and the pMOS transistor will be in the ON state. In this condition, the resistor R is effectively bypassed and the input signal IN is fed to the gates of the transistors of the main RF switch through the transistors (low impedance status). As soon as the transition ends, the input signal IN reaches a steady voltage +V. This value, coupled with the 0V voltage at gates G1 and G2 (as the voltage of G1 returns to 0V at the end of the positive pulse) will put the nMOS transistor in an OFF state (see bottom wording "OFF" under the nMOS transistor) and keep the pMOS transistor in an ON state (see bottom wording "ON" under the pMOS transistor), thus returning the dynamic gate to a high impedance status where the resistor R is not bypassed.

Reference will now be made to FIG. 2B, where considerations similar to those just exposed above will be presented. In particular, with reference to FIG. 2B, in the static condition IN=+V the gate terminals of the nMOS transistor and the pMOS transistor are at 0V. The source terminal of the nMOS transistor sees a positive signal, therefore keeping the nMOS transistor in OFF state. On the other hand, given that also the source terminal of the pMOS transistor sees a positive signal (through R), the pMOS transistor will be in an ON state. The potential of the internal node between the nMOS transistor and the pMOS transistor will be forced to about +V by the drain voltage of the pMOS transistor. These conditions are graphically represented in FIG. 2B by the upper wording "OFF" right under the nMOS transistor and the upper wording "ON" right under the pMOS transistor. In this static condition, there is no resistor bypass and the input signal IN is fed to the gates of the transistors of the main RF switch through resistor R (high impedance status).

With continued reference to FIG. 2B, when the input signal IN begins to transition from +V to −V, the nMOS transistor soon exits the OFF state and goes into an ON state. The ON state of the nMOS transistor during the transition is being graphically represented in FIG. 2B by the middle wording "ON" under the nMOS transistor. On the other hand, the gate voltage of the pMOS transistor starts receives a negative (e.g. VSS) pulse during or within a portion of the transition time window, as also shown by the square pulse representation close to gate G2 in FIG. 2B. The presence of the negative pulse on the gate G2 of the pMOS transistor while the voltage on its source transitions from +V to −V allows the pMOS transistor to stay ON during or within a portion of the transition time window. The ON state of the pMOS transistor during the transition is being graphically represented in FIG. 2B by the middle wording "ON" under the pMOS transistor.

As a consequence, also in this case, there will be a time interval inside the V+ to V− transition, having the duration of the transition or a portion thereof, where both the nMOS transistor and the pMOS transistor will be in the ON state. In this condition, the resistor R is effectively bypassed and the input signal IN is fed to the gates of the transistors of the main RF switch through the transistors (low impedance status). As soon as the transition ends, the input signal IN reaches a steady voltage −V. This value, coupled with the 0V voltage at gates G1 and G2 will put the pMOS transistor in an OFF state (see bottom wording "OFF" under the pMOS transistor) and keep the nMOS transistor in an ON state (see bottom wording "ON" under the nMOS transistor), thus returning the dynamic gate to a high impedance status where the resistor R is not bypassed.

Upon review of FIGS. 2A-2B and related written description above, the person skilled in the art will note that in the present disclosure the generation of the pulse is in the same direction of the transition. In other words, in FIG. 2A the positive pulse to the gate G1 of the nMOS transistor is formed by a 0-to-VDD step (low to high) while the input signal IN transitions from VSS to VDD (low to high). Similarly, in FIG. 2B, the negative pulse to the gate G2 of the pMOS transistor is formed by a 0-to-VSS step (high to low) while the input signal IN transitions from VDD to VSS (high to low). By having, in both cases, pulse generation heading in the same direction of the input signal transition, the resulting stress on the nMOS and pMOS transistors is advantageously reduced.

Figure 3:
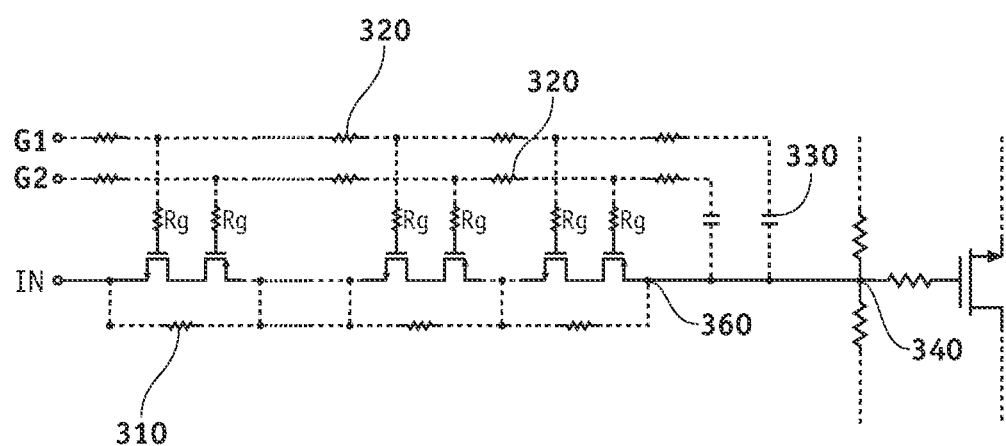
FIG. 3 shows an embodiment where the dynamic gate includes a stacked arrangement of nMOS and pMOS bypass switches.

FIG. 3 shows an embodiment of the dynamic gate arrangement discussed in the previous figures. In the embodiment of FIG. 3 a stacked arrangement of nMOS and pMOS bypass switches across respective bypassable resistors (310) is shown, together with gate resistors (Rg), rail resistors (320) and AC bias capacitors (330) on the right side the stack. Stacks having a large number of nMOS+pMOS switch pairs are preferred in order to allow the switches to withstand the full voltage swing of the RF signal during the ON condition of the main RF switch. While the number of switch pairs in the stack will depend on the type and voltage capabilities of each component switch, a typical number of switch pairs in the stack would be a number equal to the number of switches in the main stack (e.g. 24) or more.

The embodiment of FIG. 3 shows separate gate feed arrangements for the nMOS and pMOS transistors, where rail resistors (320) are provided. The presence of such rail resistors provides for a higher quality factor Q and better voltage division. Also shown is an AC bias, DC blocking, capacitor (330) for each feed arrangement, to improve voltage division across the dynamic gate stack. AC bias capacitors are discussed in detail, for example, in U.S. Pat. No. 10,236,872, owned by applicant and incorporated herein by reference in its entirety.

With continued reference to FIG. 3, during an ON to OFF switching event of the main RF switch, the input voltage IN is changed from V+ to V− e.g. +4V to −3.4V while G2 is switched from 0V to a negative voltage (e.g. −3.4V) to enable the above described turning ON the pMOS transistors in the dynamic gate structure according to the present disclosure.

It should be noted that the node (340) of FIG. 3 bridging the gate control circuitry with the gate resistive ladder of the FETs of the main switch needs to charge up to final, steady, voltage as soon as possible before high power can be applied to the main switch between RFIN and RFOUT (sec FIG. 1). However, during the transition window, the on-resistance ($R_{ON}$) contribution from both the pMOS transistor and the nMOS transistor is present, thus implying a slower charging time.

By way of example, assuming that node (360) of FIG. 3 is, e.g., at 4V and that a high-to-low transition of the signal IN from 4V to e.g. −3.4V is started (see FIG. 2B), the pMOS's of the stacked arrangement of FIG. 3 are pulsed as in FIG. 2B, but the nMOS's are slow to respond. In particular, the gate of each NMOS is at 0V, and the nMOS will stay OFF until its source voltage drops below 0V. This will need time, because at the start of the 4V to −3.4V transition the node between each nMOS and pMOS is at 4V, which factor is especially relevant for the nMOS's to the right of FIG. 3, given that the propagation delay adds up moving to the right, which implies that the initial pMOS pulse provided through the pMOS resistive network does not help in showing such problem. Similar consideration apply during a −3.4V to 4V transition.

The present disclosure addresses this problem by providing, in combination with the embodiments of FIGS. 2A, 2B and 3, a startup pulse at the gate of each pMOS during a V− to V+ transition and, similarly, a startup pulse at the gate of each nMOS during a V+ to V− transition in order to speed up the duration of the transition window, thus speeding up the charging process of the main switch.

In particular, with reference to the V+ to V− transition, the slowness of the nMOS is mitigated by introducing a short pulse (e.g. 4V for a duration of 400 ns) at the gate of the NMOS, until a voltage of about 0V is reached at the source of the pMOS. The short "startup" pulse is forced on the nMOS to turn the nMOS down, so that the intermediate node between the nMOS and the pMOS will experience a quicker movement from 4V to 0V in order for that 0V to propagate faster through the stack.

With continued reference to the V+ to V− transition, as soon as the intermediate node reaches 0V, the startup pulse is removed, because from that moment onwards the pMOS turns on, given that the pMOS has a Vth<0, and this condition starts to occur when the input signal IN reaches 0V and starts going towards more negative values. Similarly, with reference to the V− to V+ transition, a short pulse (e.g. −3.4V for a duration 400 ns) is introduced at the gate of the pMOS, until a voltage of about 0V is reached at the source of the nMOS.

Figure 4:
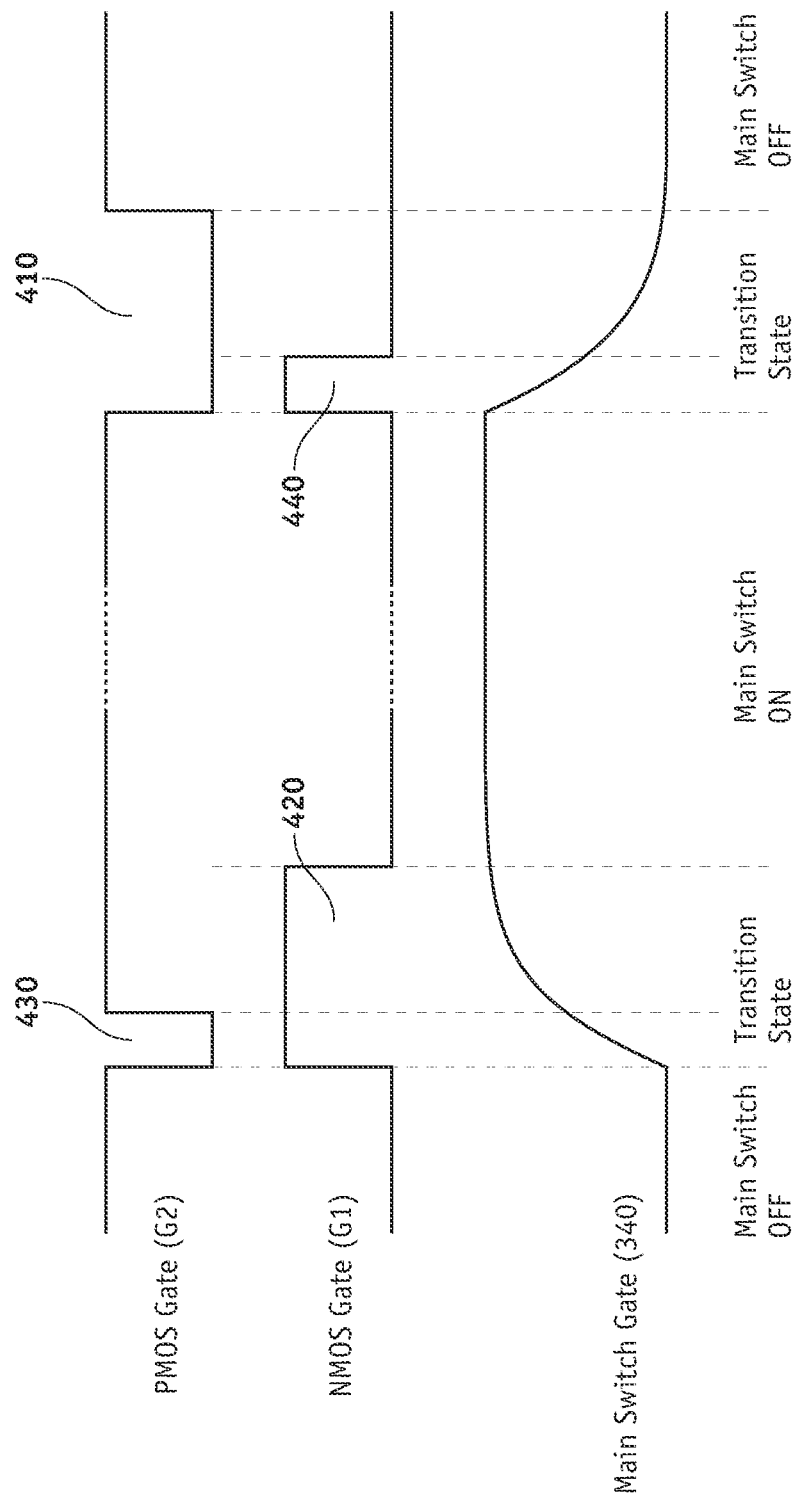
FIG. 4 shows timing diagrams with respect to the embodiments of FIGS. 2A-2B, and 3.

Reference can be made to FIG. 4, where three timing diagrams are shown. The bottom waveform shows the voltage at the common node (340) of FIG. 3 as a function of time, during ON and OFF steady states and during OFF-to-ON and ON-to-OFF transitions. The top waveform shows the voltage at the gates of the pMOS's of the gate control circuit (through input G1 of FIG. 3), switching between 0V and V− and vice versa, and the middle waveform shows the voltage at the gates of the nMOS's of the gate control circuit (through input G2 of FIG. 3), switching between 0V and V+ and vice versa. Time windows (410) and (420) show the shape and duration of the pMOS and nMOS gate pulses previously described with reference to FIGS. 2B and 2A, respectively. Such pulses are present during or within a portion of the transition time window of the main switch signal. By way of example, the duration of each such pulse can be 1 us.

Also shown in FIG. 4 are the previously described pMOS and nMOS startup pulses (430) and (440) respectively, each of which has a duration shorter than a duration of the associated nMOS and pMOS pulses (420) and (410) respectively. The startup pulse of one of the nMOS or pMOS transistors will start around the same time of the associated pulse of the other one of the nMOS or pMOS transistors (i.e. at the beginning of the transition state of the main switch signal) and will have a preferred duration of less than half than the duration of the associated pulse, e.g. 400 ns in case of a 1 us duration of the associated pulse.

In particular, the duration of the startup pulses (430, 440) should not be too much in order to avoid potential breakdown on the transistor on which the pulse is applied. More generally, the duration of the startup pulses is also a function of parameters such as the number of switches in the bypass stack (the lower the number, the shorter the pulse) and the impedance seen at the "common" node (340) of FIG. 3 connecting the bypass stack to the gate resistor ladder. On the other hand, turning to the longer associate pulses (420, 410) duration, such duration sets the initial slope of the main switch gate voltage curve during the transition state. As seen from the slope of the curve during the transition state, the presence of the startup pulse allows a steeper behavior at the beginning of the transition state (initial slope is more vertical), thus a faster reaching of a steady state, with a consequent ability of the main switch to be ready for high power. Absence of the startup pulse would, on the other hand, imply a slower charge-up time (initial slope less vertical) and a longer associated pulse.

Upon review of the embodiments of FIGS. 2A, 2B and 3 and related timing diagrams of FIG. 4, the person skilled in the art will understand that several modifications, still falling within the scope of the present disclosure, are possible. By way of example, while the figures show the nMOS transistor on the left side and the pMOS transistor on the right side, embodiments are also possible where the order of the transistors is inverted. Additionally, while the figures show a single bypassable resistor R per nMOS/pMOS pair, embodiments are also possible where, e.g., two resistors are provided, with a node between the resistors connected to a node between the transistors. Therefore, whenever the term resistor is used throughout the present specification and claims to indicate the bypassable resistor R, its meaning will not have to be confined to a single resistor, but will also be intended to include two or more resistors.

Figure 5A:
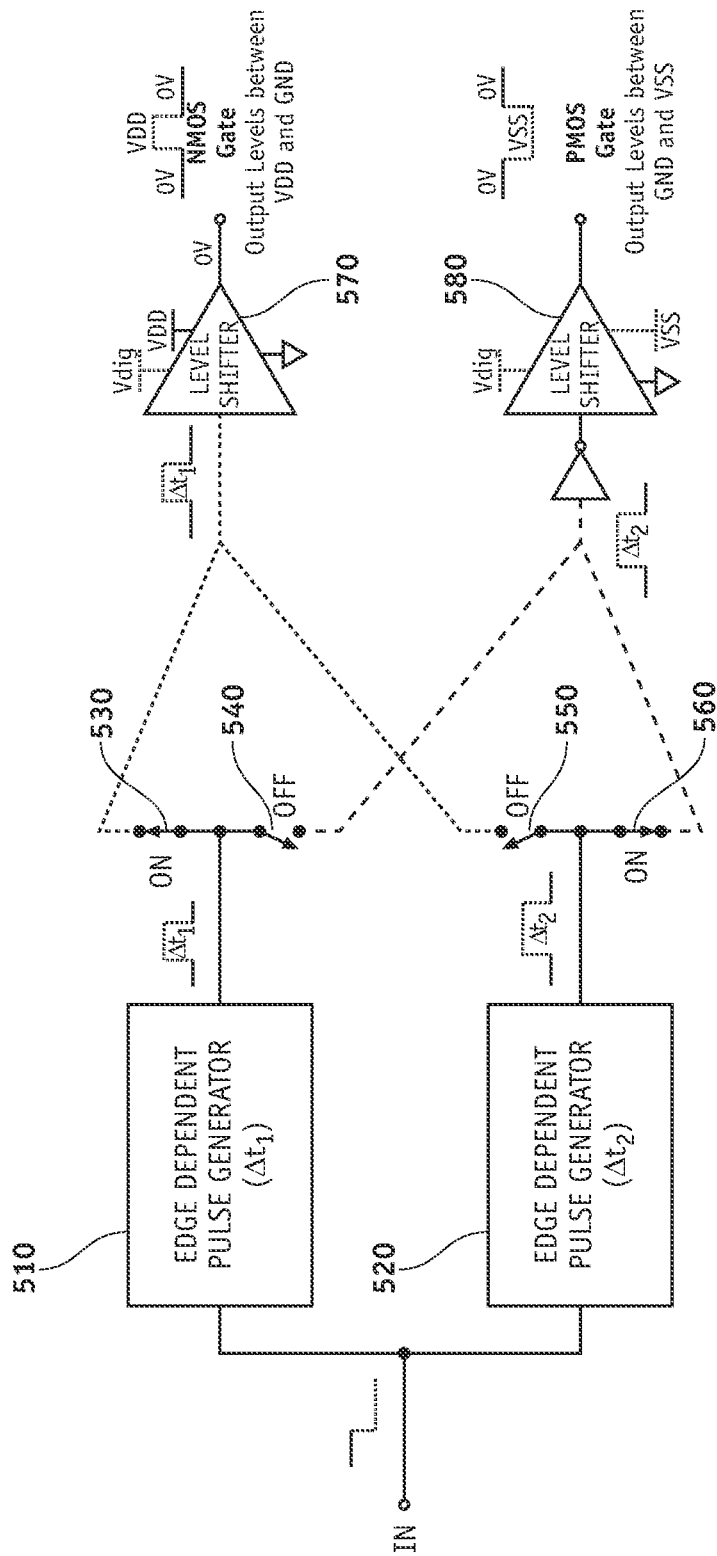
FIGS. 5A-5B show an embodiment of a control circuitry for use with the dynamic gate of FIGS. 2A-2B, and 3.
Figure 5B:
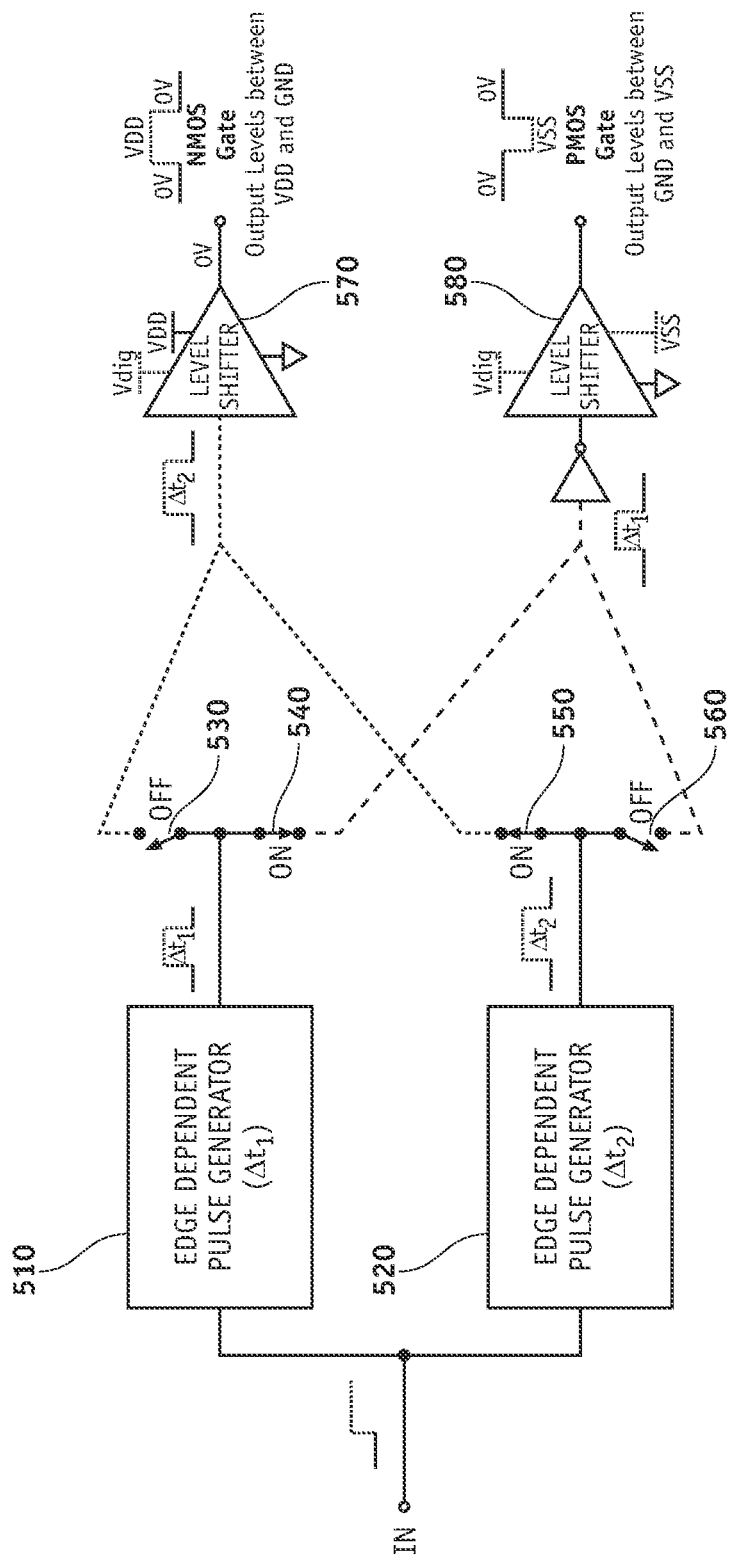

The voltage pulses (410, 420, 430, 440) shown in FIG. 4 for the gates of the nMOS and pMOS transistors during the transition state of the main switch signal can be generated through a dedicated control circuitry, as shown, for example, in FIGS. 5A-5B.

FIGS. 5A and 5B shows an embodiment of a control circuitry in accordance with the teachings of the present disclosure and its implementation during a V+ to V− transition (FIG. 5A) or a V− to V+ transition (FIG. 5B) of the gate control signal IN. The control circuitry of each figure comprises edge-dependent pulse generators (510, 520) to generate pulses having a shorter duration Δt1 and a longer duration Δt2, respectively. The status of switches (530, 540, 550, 560) will control whether the two pulses are applied to an nMOS and a pMOS (V+ to V− transition, FIG. 5A), or a pMOS and nMOS (V− to V+ transition, FIG. 5B), respectively.

In the diagram of FIG. 5A switches (530) and (560) are ON, while switches (540) and (550) are OFF. In such case, the pulse with longer duration Δt2 will be inverted, processed by level shifter (580), which will change its digital levels to 0V/VSS output levels, and fed to the gates of the pMOS transistors of the circuit of FIG. 3. On the other hand, the pulse with shorter duration Δt1 will be processed by level shifter (570), which will change its digital levels to 0V/VDD, and fed to the gates of the nMOS transistors of the circuit of FIG. 3.

Turning now to the diagram of FIG. 5B, switches (530) and (560) are OFF, while switches (540) and (550) are ON. In such case, the pulse with shorter duration Δt1 will be inverted, processed by level shifter (580), which will change its digital levels to 0V/VSS output levels, and fed to the gates of the pMOS transistors. On the other hand, the pulse with longer duration Δt2 will be processed by level shifter (570), which will change its digital levels to 0V/VDD, and fed to the gates of the nMOS transistors.

Figure 6A:
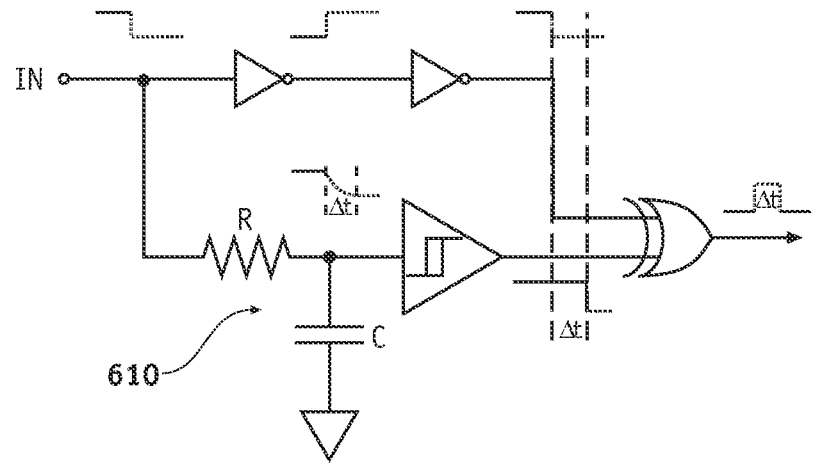
FIGS. 6A-6B show an embodiment of the edge-dependent pulse generator shown in FIGS. 5A-5B.
Figure 6B:
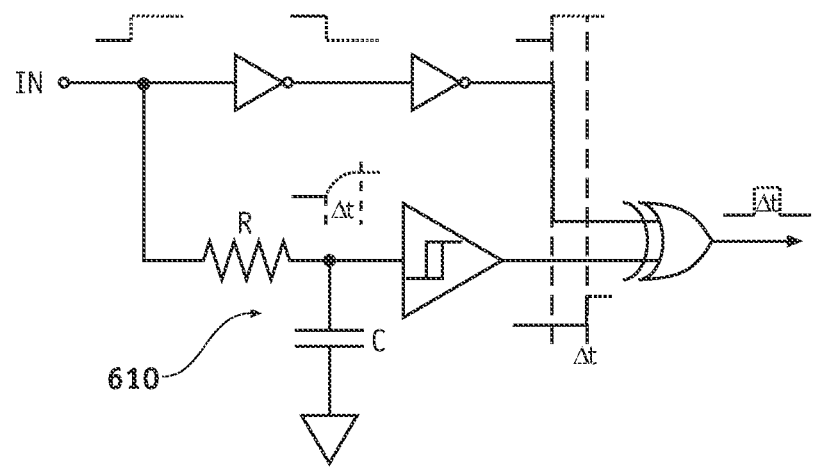

FIGS. 6A-6B show an embodiment of edge dependent pulse generators (510, 520) previously shown in FIGS. 5A-5B, each of which can be built with a same circuit including inverters, an RC circuit (610), a Schmitt trigger and a XOR port, wherein the length of the time window (Δt1 or Δt2) can be controlled by controlling the R and C values of circuit (610). In particular, FIG. 6A shows the behavior of the edge pulse generator during a V+ to V− transition, while FIG. 6B shows the behavior of the edge pulse generator during a V− to V+ transition.

In the following paragraphs additional embodiments of the present disclosure to speed up the gate charging of the main RF switch (see, e.g., node (340) of FIG. 3) will be described.

Figure 7:
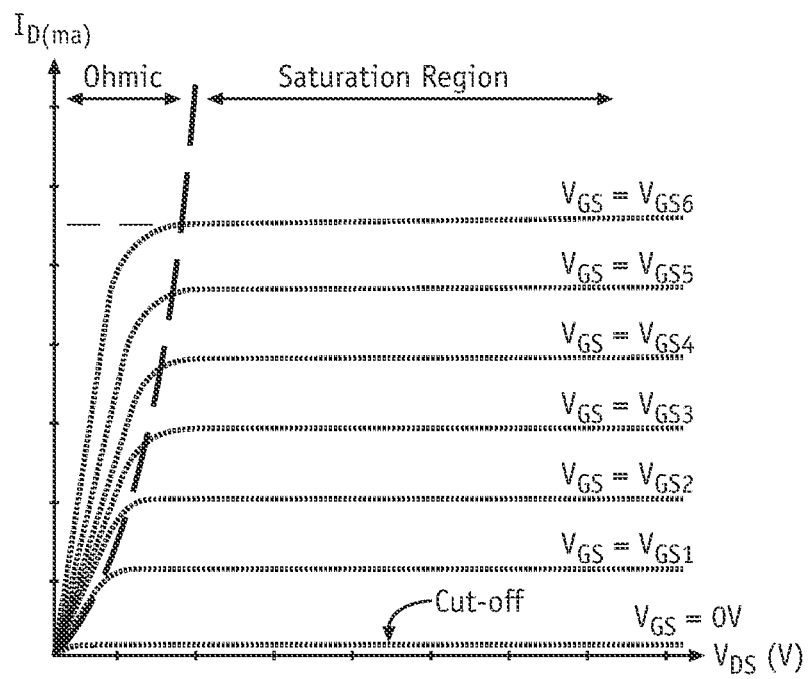
FIG. 7 shows Vds v. Id nFET characteristic curves for different values of Vgs of the nFET.

The charging current is a function of the Vds and Vgs voltages of the NMOS/PMOS bypass switch. As shown in the Vds v. Id diagram of FIG. 7, when the gate of the main switch approaches the final voltage (e.g. 4V or −3.4V), the charging current is reduced with a consequent slower settling of the final voltage at the gate of the main switch. By way of example, during a V− to V+ transition, the voltage at the node to the right of the bypass circuit moves forwards, the level shifter driving the node to the left of the bypass circuit also moves forwards, with a consequence that the Vds of the NMOS switch becomes smaller and gets close to 0V. As shown in the ohmic region of the diagram of FIG. 7, small values of Vds can provide a limited amount of charging current. As a consequence, the signal at the end of the V− to V+ transition period takes longer to settle down. Similar considerations apply in case of a V+ to V− transition.

The present disclosure addresses such problem by using, during the transition window, Vds and Vgs voltages that are higher than the level of the high static state of the input signal IN or respectively lower than the level of the low static state of the input signal IN (e.g. 5V in a V− to V+ transition when compared to 4V or 3.4V and −5V in a V+ to V− transition when compared to −4V or −3.4V), in order to provide a higher charging current. As shown in the example representation of FIG. 8, which shows a bypass circuit according to the present disclosure during a V− to V+(e.g. −3.4V to 3.4V or 4V) transition period, the voltages at the gate of the nMOS (810) and at the left node of the circuit (820) are set at a voltage higher than 3.4V (e.g. 5V as shown in the figure) to speed up the settling time at the end of the transition. Similar considerations apply with reference to the gate of the pMOS (830) and the left node of the circuit (820) during a V+ to V− transition.

Figure 9:
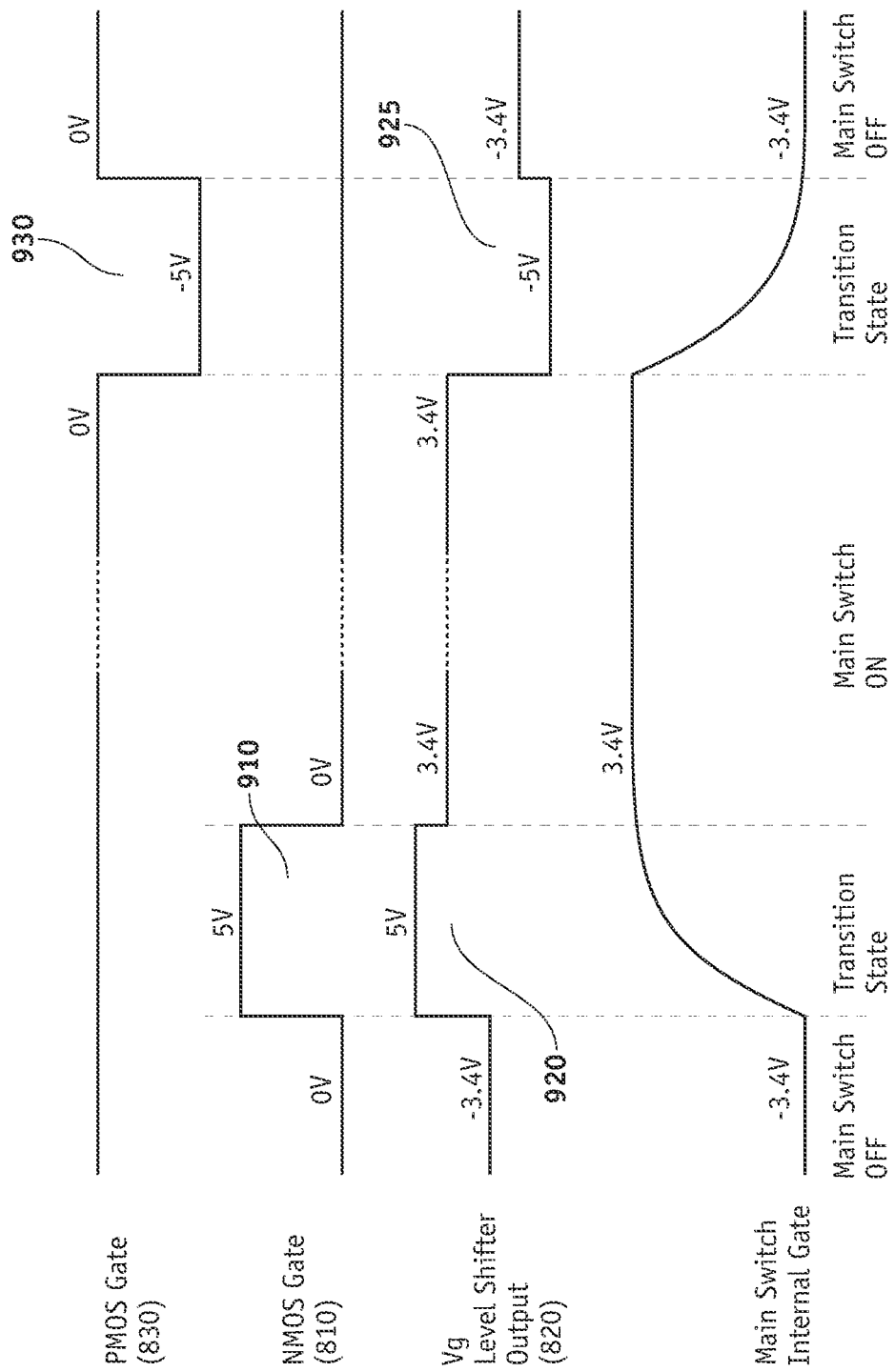
FIG. 9 shows a first series of timing diagrams in accordance with the teachings of FIG. 8.

The behavior of such circuit is explained in more detail in the timing diagrams of FIG. 9, where windows (910, 920, 925, 930) show how the voltage at nodes (810, 820, 830) is increased, during the V− to V+ and V+ to V− transition windows, at values that are higher (e.g. 5V) than the settling voltage (the latter equal to 3.4V in the example of the figure). As a consequence, the behavior of the signal at the main switch internal gate during the transition states becomes steeper.

Figure 8:
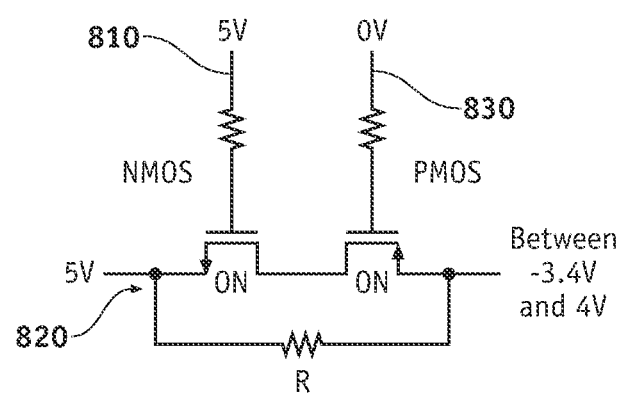
FIG. 8 shows a circuital embodiment of the present disclosure, where higher Vgs and/or Vds amounts are applied.

However, with reference to such diagram, the inventors have noted that keeping a higher voltage on the terminals (810, 820, 830) of the circuit of FIG. 8 for the entire span of the transition state can potentially have a negative impact on the operational safety of the circuit, such as risk of breakdown. Additionally, such increase is needed around the end of the transition (not at the beginning), i.e. when Vds is smallest. As a consequence, a preferred embodiment is represented in the timing diagrams of FIG. 10, where the voltage at nodes (810, 820, 830) is increased at values that are higher than the settling voltage not for the entire duration of the transition window, but only during a later portion of the same, e.g. the latter half or the latter third of the same.

Figure 10:
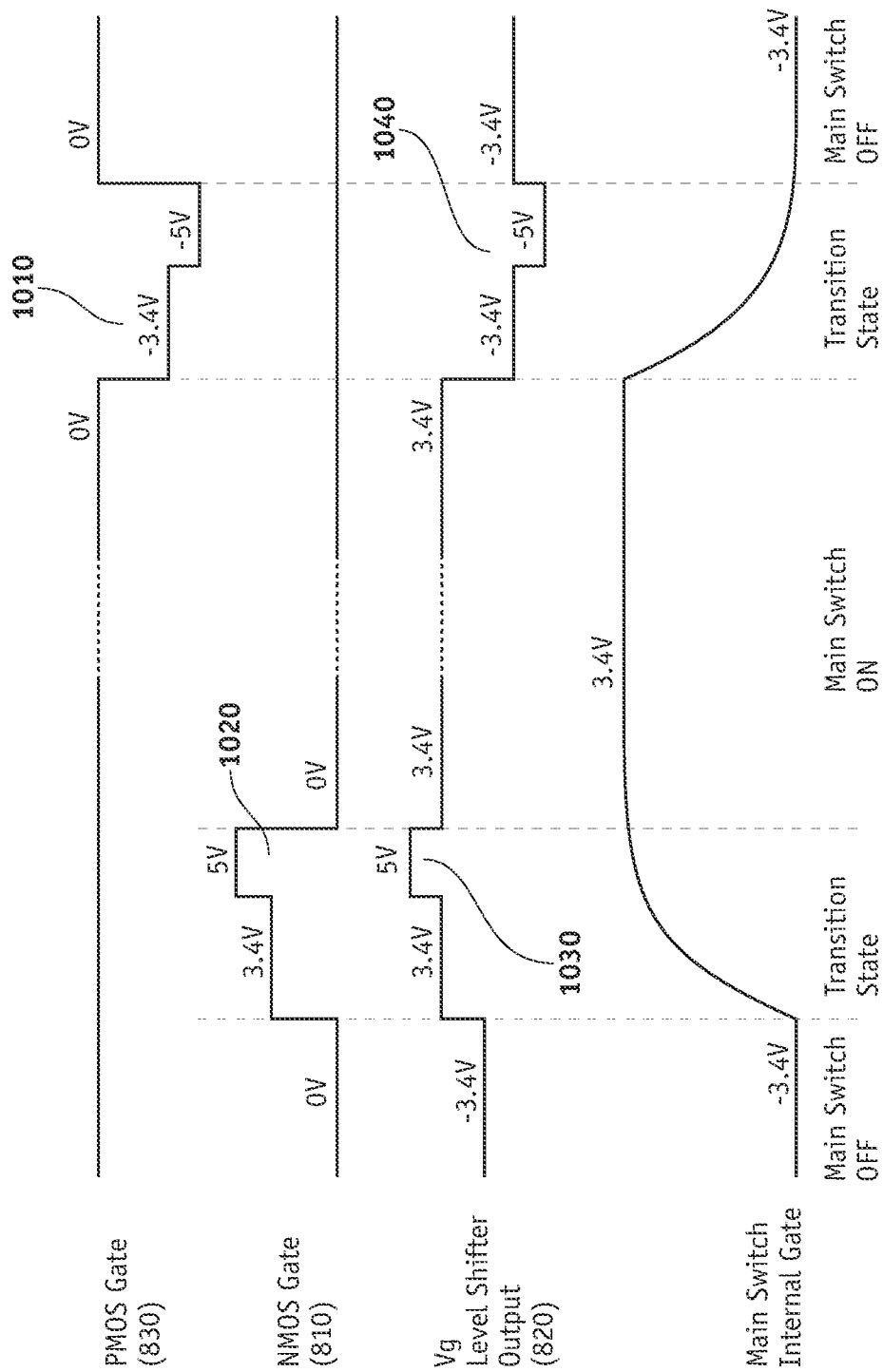
FIG. 10 shows a second series of timing diagrams in accordance with the teachings of FIG. 8, where higher Vgs and/or Vds are applied for a portion of the transition state of the main RF switch.
Figure 11:
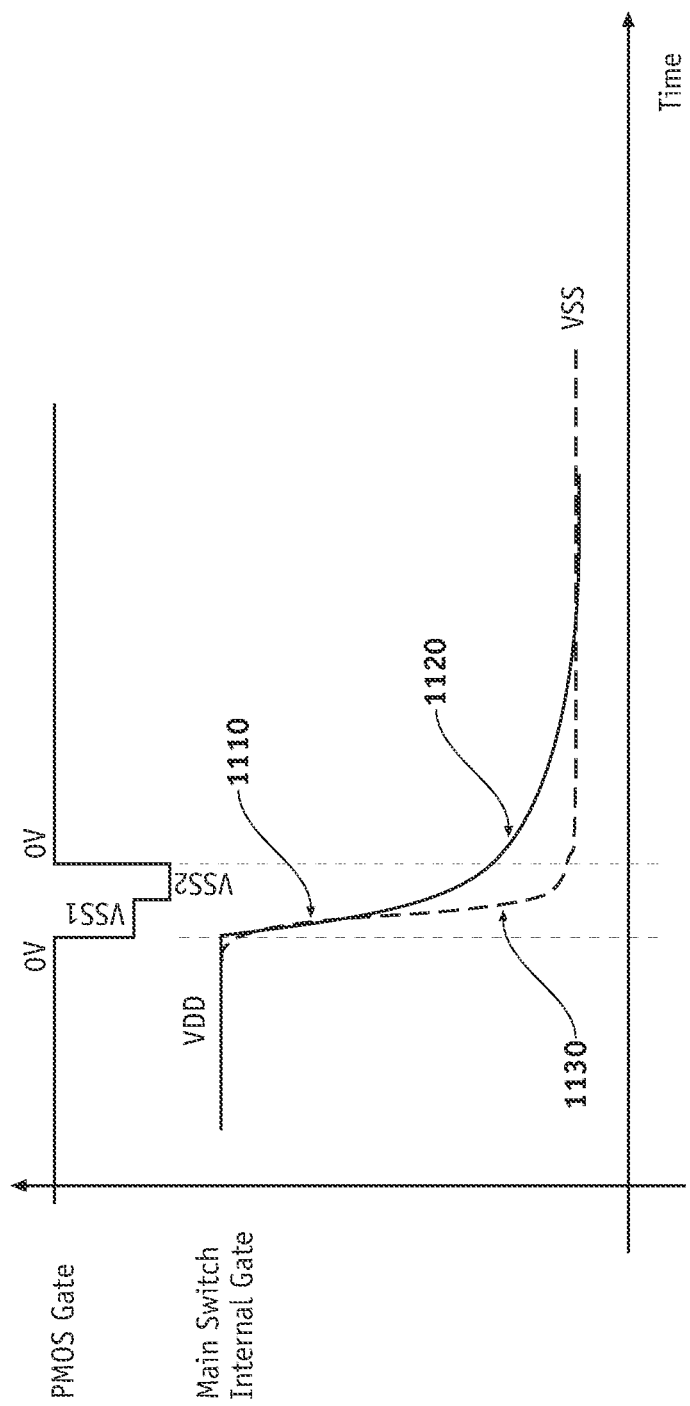
FIG. 11 shows the settling time speed-up effects of the embodiments according to FIGS. 8-10.

FIG. 11 shows in greater detail the behavior of the voltage at the node (340) of FIG. 3 during the transition period without (solid curve) and with (broken-line curve) the teachings of the embodiment of FIG. 9 or 10. Reference numeral (1110) represents the time instant inside the transition window where a sharp change in gate voltage v. time begins to occur. Without the embodiment of FIG. 9 or 10, the gate voltage v. time curve would be shaped as in (1120), which means that as the gate voltage approaches the final value (getting close to VSS) in the V+ to V− transition of the figure, the charging current is reduced with the consequence of requiring more time to reach the final VSS value. On the other hand, with the boosting technique shown in FIG. 9 or 10, the charging current remains in a high charging current region with a consequent steeper gate voltage vs time change (1130).

The two-stepped voltage pulses shown in FIG. 10 for the gates of the nMOS and pMOS transistors (Vgs increase) and for the output of the level shifter at the left node of the bypass circuit (Vds increase) during the transition state of the main switch signal can be generated through a dedicated control circuitry, as shown in the next figures. In particular, FIGS. 12A, 13A and 14A show operation of the control circuitry during a low-to-high transition of the main switch, while FIGS. 12B, 13B and 14B show operation of the control circuitry during a high-to-low transition of the main switch.

Figure 12A:
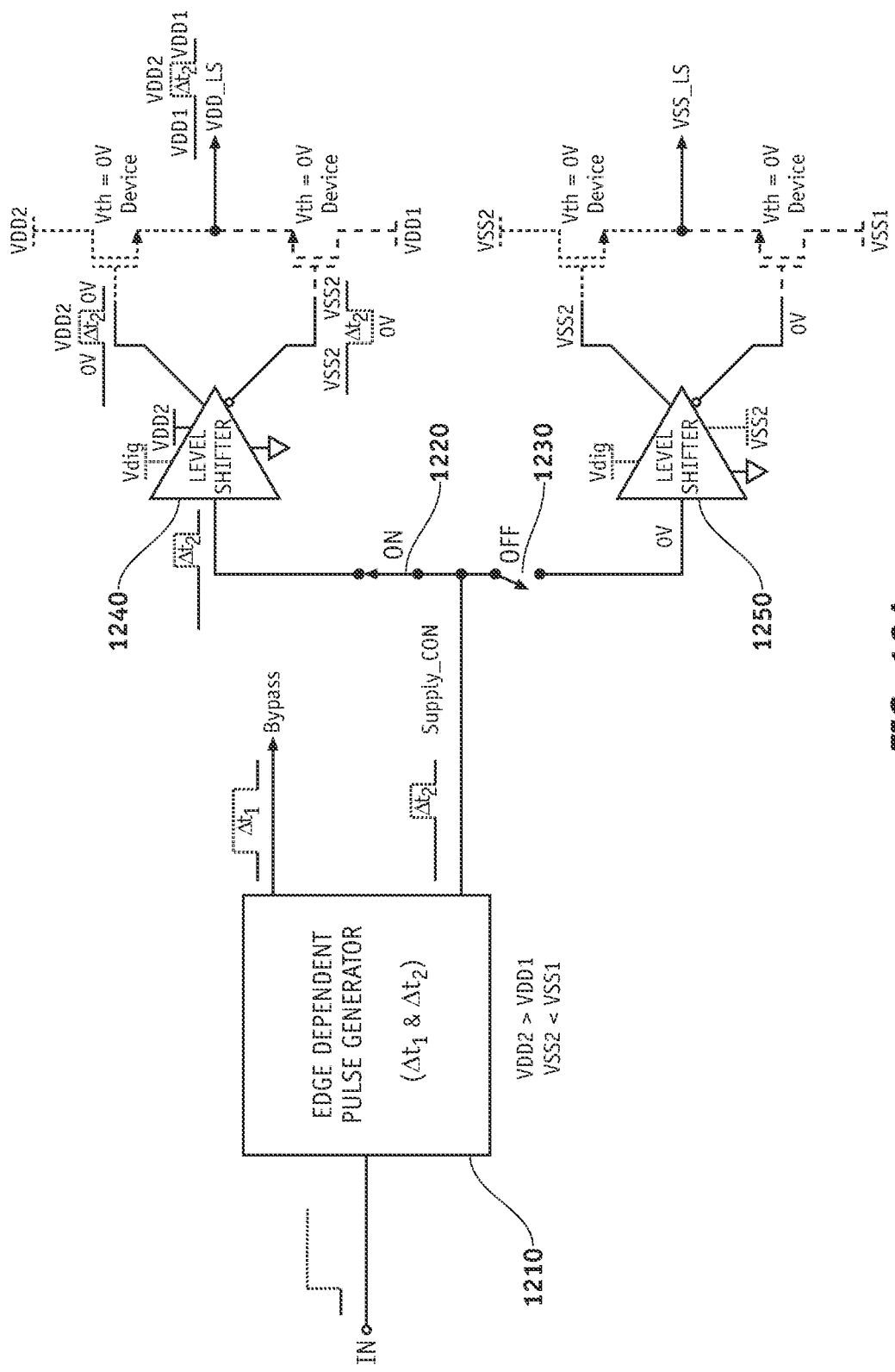
FIGS. 12A, 13A and 14A show an embodiment of a control circuitry for use with the dynamic gate of FIG. 8 during a low-to-high transition of the main switch signal.
Figure 12B:
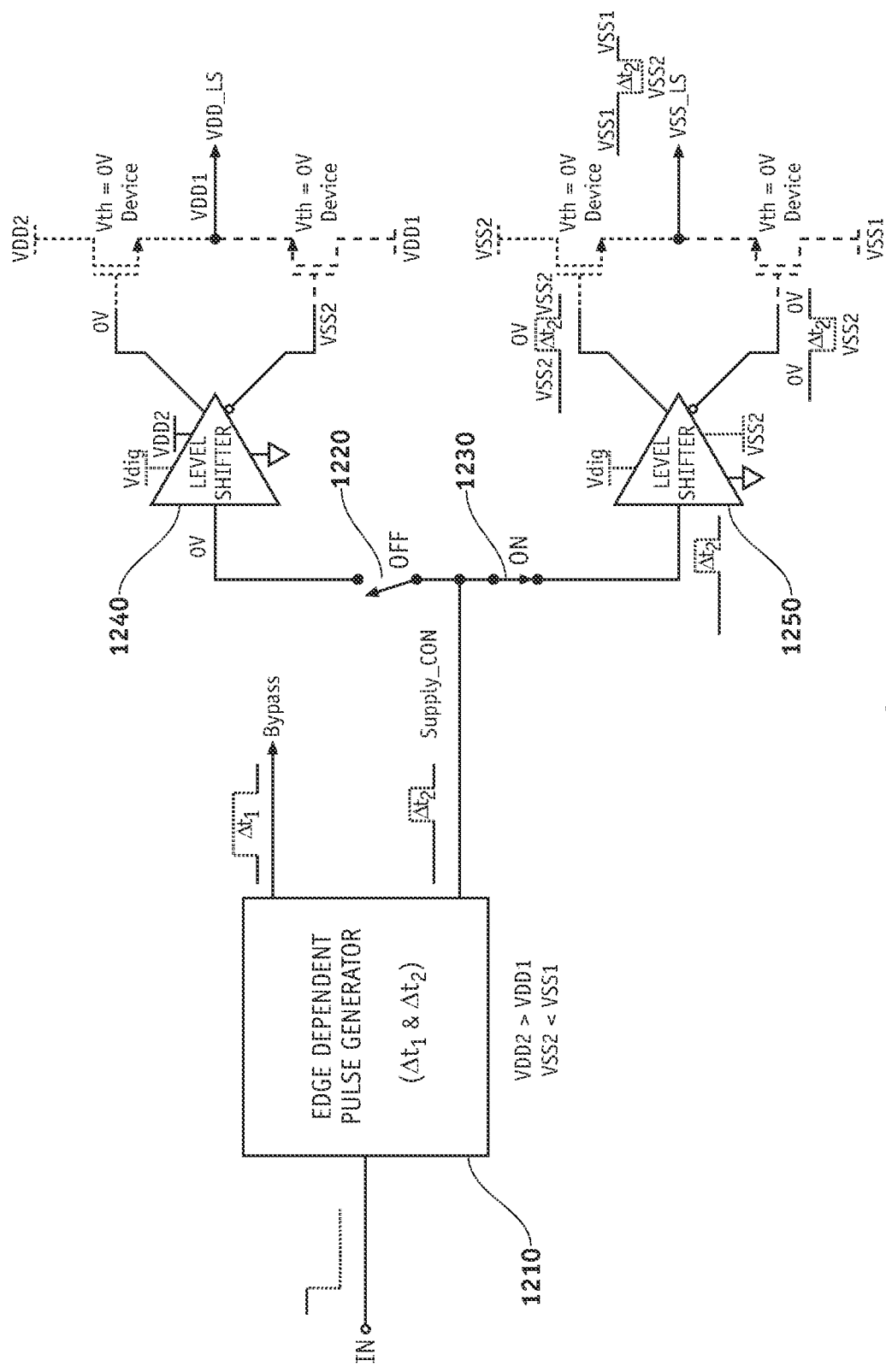
FIGS. 12B, 13B and 14B show the control circuitry already shown in FIGS. 12A, 13A and 14A, this time during a high-to-low transition of the main switch signal.

FIG. 12A shows a first block diagram of control circuitry configured to operate during a low-to-high transition of the main switch. An edge-dependent pulse generator (1210) generates a pulse with a longer duration ($\Delta t1$) and a pulse with a shorter duration ($\Delta t2$). Processing of the pulse with shorter duration ($\Delta t2$) will now be described. Such pulse will be used to set the time windows (1010), (1020) and (1030) previously shown in FIG. 10. Switch (1220) is ON while switch (1230) is OFF, thus routing pulse ($\Delta t2$) towards upper level shifter (1240). Upper level shifter (1240) has supply voltages of 0V and VDD2, wherein VDD2 corresponds to the higher voltage, e.g. 5V, shown in windows (1020) and (1030) of FIG. 10. Therefore, the signal at the output of upper level shifter (1240) has a lower level of 0V and upper level of VDD2. The circuitry to the right of level shifter (1240) is configured to raise the lower level to a value VDD1<VDD2, e.g. 3.4V, where VDD1 usually equals to the steady value VDD (V+). Therefore, the signal at the output VDD_LS is a signal with a lower level of VDD1 and an upper level of VDD2, the latter for a gate pulse duration $\Delta t2$.

Figure 13A:
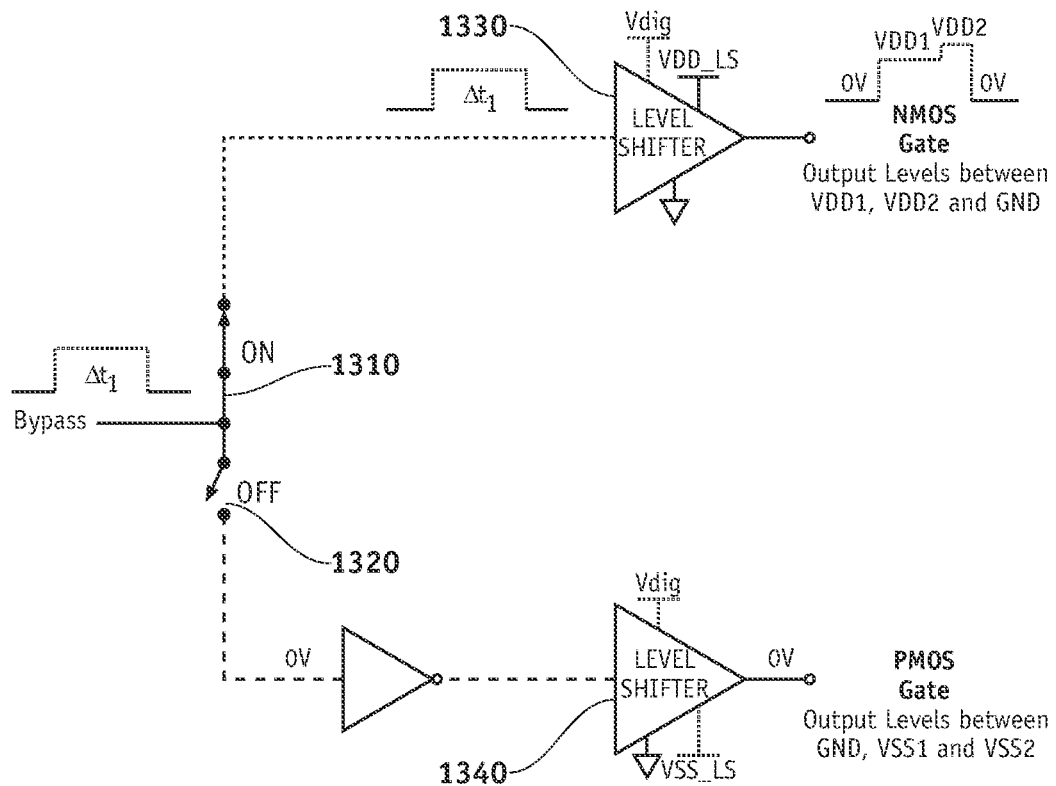

FIG. 13A shows a second block diagram of control circuitry configured to operate during a low-to-high transition of the main switch, where the path of the pulse with longer duration ($\Delta t1$) previously shown in FIG. 12A is now followed. Switch (1310) is ON while switch (1320) is OFF, thus routing pulse ($\Delta t1$) towards upper level shifter (1330). Upper level shifter (1330) has supply voltages of 0V and VDD_LS, the latter corresponding to the upper output of the circuit previously shown in FIG. 12A. In other words, the upper supply voltage of upper level shifter (1330) is dynamic (i.e. it changes in time) and will provide an output signal like the one shown on the top right of FIG. 13A, with levels of 0V, VDD1 and VDD2 in order to shape the nMOS gate window as shown in FIG. 10.

Figure 14A:
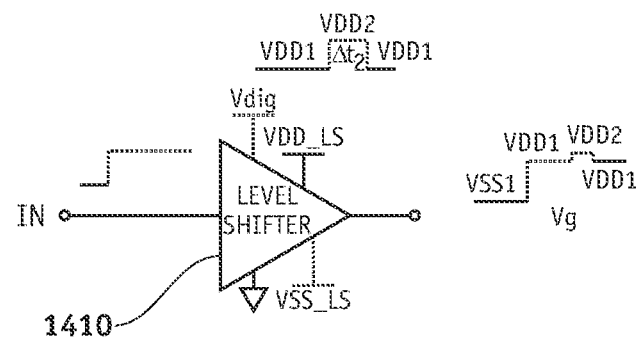
Figure 13B:
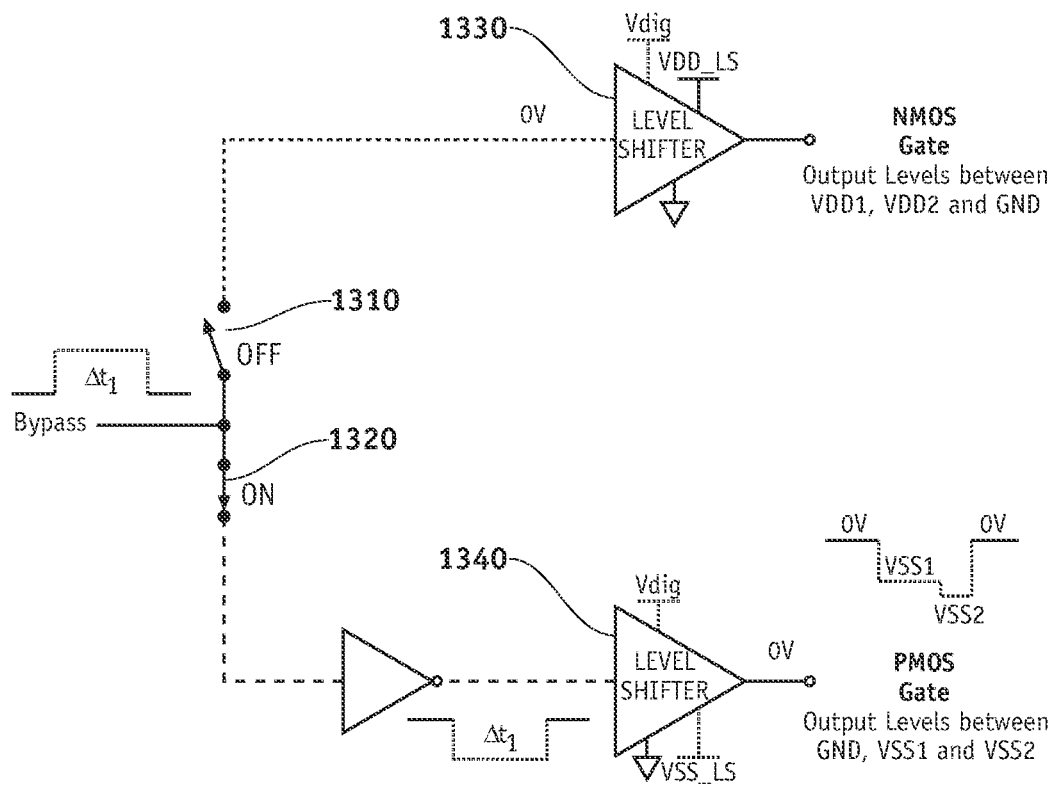
Figure 14B:
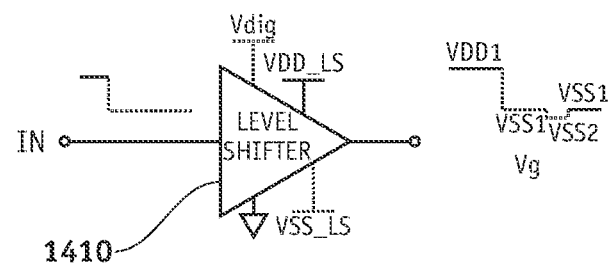

While FIG. 13A shows how to control the signal at NMOS gate (810) of FIG. 8 in order to control the Vgs of the nMOS transistor (similar considerations will apply to the pMOS in the representation of FIG. 13B), the following FIG. 14A shows how to control the signal input at the left node (820) of FIG. 8 at the same time, as also shown in the "Vg level shifter output" time diagram of FIG. 10. Such control signal controls the gate voltage of the main RF switch and thus allows control of the Vds of the nMOS and pMOS transistors. In particular, FIG. 14A shows a level shifter (1410) with an upper supply voltage of VDD_LS (same as level shifter (1330) of FIG. 13A), which will provide an output signal like the one shown on the right of FIG. 14A, with levels of VSS1, VDD1 and VDD2 in order to shape the Vg level shifter output window as shown in FIG. 10.

FIGS. 12B (where pulse ($\Delta t2$) is routed towards lower level shifter (1250)), 13B (where pulse ($\Delta t1$) is routed towards lower level shifter (1340)), and 14B show operation of the control circuitry during a high-to-low transition of the main switch. Explanation of such circuitry and its operation will not be given in detail, as it is straightforward from the above provided description of FIGS. 12A, 13A and 14A.

Figure 15:
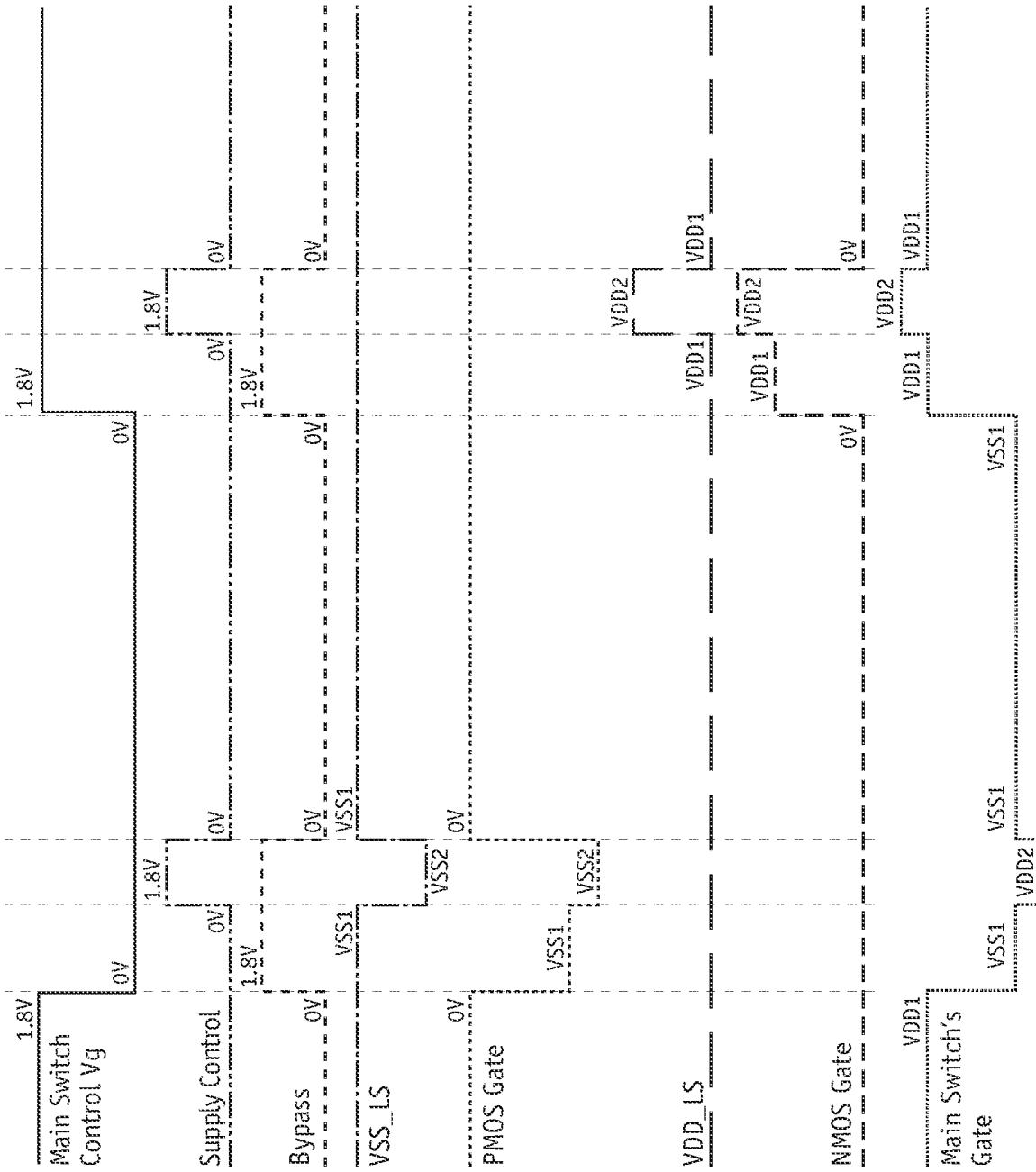
FIG. 15 shows a third series of timing diagrams in accordance with the teachings of FIG. 8, this time specifically applied to the control circuitry shown in FIGS. 12A-B, 13A-B and 14A-B.

FIG. 15 shows a timing diagram similar to the one already described with reference to FIG. 10, where the terminology and the behavior of the waveforms described in FIGS. 12A-B, 13A-B, and 14A-B are depicted in detail.

While the startup pulse according to the present disclosure is applied at the initial stage of the transition state (sec, e.g., FIG. 4), the increased voltage at the nMOS and pMOS gates and/or at the Vg level shifter output is applied in the second half of the transition state (see, e.g., FIG. 10). Therefore, embodiments are possible where not only the startup pulse or the increased voltage are applied, but also their combination. Additionally, with reference to, e.g., FIG. 10, the increased voltage can be applied not only to the nMOS/pMOS gates (higher Vgs of the nMOS/pMOS transistors) and the Vg level shifter output (higher Vds of the nMOS/pMOS transistors) in combination, but also separately and independently to each of them, if desired or required.

Figure 16:
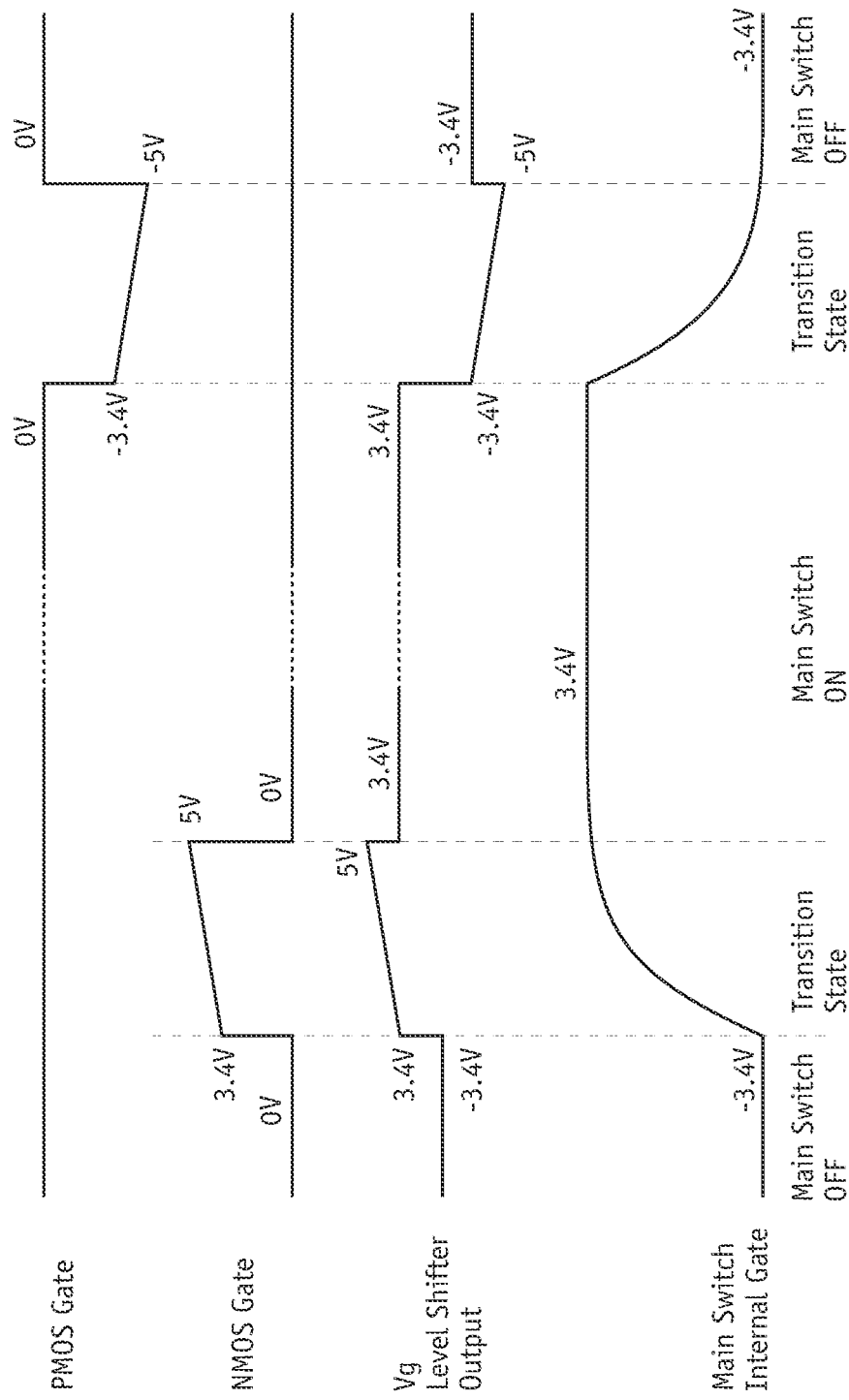
FIG. 16 shows a fourth series of timing diagrams in accordance with the teachings of FIG. 8.

As already noted before, the higher voltage (e.g. 5V) on the terminals (810, 820, 830) of FIG. 8 should preferably not be applied for the entire span of the transition state. While FIGS. 10-15 have shown a first way to do so (a two-stepped approach), other embodiments are also possible, such as a multi-step approach or even a gradual rising or falling approach (curved or linear) like for example the one shown in FIG. 16, where the increase to higher (or lower) levels of the voltage at terminals (810, 820, 830) is linear.

As noted before, the present application may be related to U.S. patent application Ser. No. 17/374,927 for a "Gate Resistor Bypass For RF FET Switch Stack", co-owned by Applicant, filed on Jul. 13, 2021. Such application also describes and shows embodiments with charge removal diodes coupled to the nMOS transistor and the pMOS transistor and/or a clamping circuit coupled across the pMOS transistor, configured to provide a current conduction path upon decrease of gate voltage of the pMOS transistor. Such embodiments, although not expressly described in the present application, are incorporated herein by reference in their entirety.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method to controllably bypass a resistor across a series combination of an nMOS transistor and a pMOS transistor, the series combination receiving a control signal that switches from a first static state to a second static state and vice versa, the method comprising:
   in the first static state of the control signal, setting of the nMOS transistor in an ON state and setting the pMOS transistor in an OFF state, the ON state of the nMOS transistor and the OFF state of the pMOS transistor establishing or re-establishing a high impedance status of the series combination and not bypassing the resistor;
   during a first transition of the control signal from the first static state to the second static state, keeping the nMOS transistor in the ON state, and setting the pMOS transistor in an ON state, the ON state of the nMOS transistor and the ON state of the pMOS transistor establishing a low impedance status of the series combination and bypassing the resistor; and
   in the second static state of the control signal, keeping the pMOS transistor in the ON state, and setting the nMOS transistor in an OFF state, the OFF state of the nMOS transistor and the ON state of the pMOS transistor establishing or re-establishing a high impedance status of the series combination and not bypassing the resistor.

2. The method of claim 1, further comprising:
   during a second transition of the control signal from the second static state to the first static state, keeping, for at least a first portion of the second transition, the pMOS transistor in the ON state, and for a remaining part of the second transition, setting the nMOS transistor in an ON state, the ON state of the nMOS transistor and the ON state of the pMOS transistor re-establishing a low impedance status of the series combination and bypassing the resistor.

3. The method of claim 1, further comprising:
   providing the control signal to an RF FET switch, thereby controlling ON and OFF status of the RF FET switch, wherein the RF FET switch is a stacked RF FET switch.

4. The method of claim 2, further comprising:
   providing the control signal to an RF FET switch, thereby controlling ON and OFF status of the RF FET switch, wherein
   the first transition is a transition from the OFF status to the ON status of the RF FET switch, and
   the second transition is a transition from the ON status to the OFF status of the RF FET switch.

5. The method of claim 2, further comprising:
in the first static state of the control signal, setting a gate terminal of the nMOS transistor at a first nMOS gate voltage and a gate terminal of the pMOS transistor at a first pMOS gate voltage, thereby setting the nMOS transistor in the ON state and the pMOS transistor in the OFF state:
during the first transition, feeding, for at least a first portion of the first transition, the gate terminal of the nMOS transistor with a second nMOS gate voltage higher than the first nMOS gate voltage, thereby keeping the nMOS transistor in the ON state, and feeding, during an initial portion of the first transition, the gate terminal of the pMOS transistor with a second pMOS gate voltage lower than the first pMOS gate voltage and keeping, for a remaining portion of the first transition, the gate terminal of the pMOS transistor at the first pMOS gate voltage, thereby setting the pMOS transistor in the ON state;
during the second transition, feeding, for the first portion of the second transition, the gate terminal of the pMOS transistor with the second pMOS gate voltage, thereby keeping the pMOS transistor in the ON state, and feeding, during an initial portion of the second transition, the gate terminal of the nMOS transistor with the second nMOS gate voltage and keeping, for a remaining portion of the second transition, the gate terminal of the nMOS transistor at the first nMOS gate voltage, thereby setting the nMOS transistor in the ON state, wherein
the at least first portion of the first transition has a duration of more than half of the first transition and the at least first portion of the second transition has a duration of more than half of the second transition; and
the initial portion of the second transition has a duration of less than half of the second transition and the initial portion of the first transition has a duration of less than half of the first transition.

6. The method of claim 2, further comprising:
providing the control signal to an RF FET switch, thereby controlling ON and OFF status of the RF FET switch, wherein
a gate terminal of the nMOS transistor is configured to be a first nMOS gate voltage during at least a portion of the ON status of the RF FET switch and at least a portion of the OFF status of the RF FET switch; and
a gate terminal of the pMOS transistor is configured to be at a first pMOS gate voltage during at least a portion of the ON status of the RF FET switch and at least a portion of the OFF status of the RF FET switch.

7. The method of claim 6, wherein the first nMOS gate voltage is 0V and the first pMOS gate voltage is 0V.

8. The method of claim 1, wherein the series combination of an nMOS transistor and a pMOS transistor is an arrangement of series combinations of an nMOS transistor and a pMOS transistor, each series combination connected across respective one or more resistors.

9. The method of claim 2, further comprising:
coupling a control circuit to a gate terminal of the nMOS transistor and to a gate terminal of the pMOS transistor, the control circuit comprising a first edge-dependent pulse generator and a second edge-dependent pulse generator, and
based on the coupling, controlling time transitioning of voltages at the gate terminal of the nMOS transistor and at the gate terminal of the pMOS transistor via the first edge-dependent pulse generator and the second edge-dependent pulse generator.

10. The method of claim 9, further comprising:
controlling, via the first edge-dependent pulse generator, time transitioning of voltage at the gate terminal of the nMOS transistor between a first nMOS gate voltage and a second nMOS gate voltage during an initial portion of the second transition and time transitioning of voltage at the gate terminal of the pMOS transistor between a first pMOS gate voltage and a second pMOS gate voltage during an initial portion of the first transition; and
controlling, via the second edge-dependent pulse generator, time transitioning of voltage at the gate terminal of the nMOS transistor between the first nMOS gate voltage and the second nMOS gate voltage during the at least a first portion of the first transition and time transitioning of voltage at the gate terminal of the pMOS transistor between the first pMOS gate voltage and the second pMOS gate voltage during the at least first portion of the second transition.

11. The method of claim 9, wherein each of the first edge-dependent pulse generator and the second edge-dependent pulse generator comprise an RC circuit, the RC circuit of the first edge-dependent pulse generator having an RC time constant shorter than an RC time constant of the RC circuit of the second edge-dependent pulse generator.

12. The method of claim 11, wherein the first edge-dependent pulse generator and the second edge-dependent pulse generator each further comprise a Schmitt trigger and an XOR gate.

13. The method of claim 9, wherein the control circuit further comprises a first level shifter and a second level shifter,
the first level shifter selectively connected to an output of the first edge-dependent pulse generator during the second transition and to an output of the second edge-dependent pulse generator during the first transition,
the second level shifter selectively connected to the output of the first edge-dependent pulse generator during the first transition and to the output of the second edge-dependent pulse generator during the second transition,
the first level shifter shifting levels of the output of the first edge-dependent pulse generator and the second edge-dependent pulse generator between a first nMOS gate voltage and a second nMOS second gate voltage; and
the second level shifter shifting levels of the output of the first edge-dependent pulse generator and the second edge-dependent pulse generator between a first pMOS gate voltage and a second pMOS gate voltage.

14. The method of claim 2, further comprising:
during the first transition, feeding, for at least a second portion of the first transition that follows at least a first portion of the first transition, a gate terminal of the nMOS transistor a third nMOS gate voltage that is higher than a second nMOS gate voltage; and
during the second transition, feeding, for at least a second portion of the second transition that follows at least a first portion of the second transition, the gate terminal of the pMOS transistor a third pMOS gate voltage that is lower than a second pMOS gate voltage, wherein
in the first static state, the gate terminal of the nMOS transistor is at a first nMOS gate voltage and the gate terminal of the pMOS transistor is at a first pMOS gate voltage,
for the at least first portion of the first transition, the gate terminal of the nMOS transistor is at the second nMOS gate voltage that is higher than the first nMOS gate voltage, and
for the at least first portion of the second transition, the gate terminal of the pMOS transistor is at the second pMOS gate voltage that is lower than the first pMOS gate voltage.

15. The method of claim 14, further comprising:
providing the control signal to an RF FET switch, thereby controlling ON and OFF status of the RF FET switch, wherein
the third nMOS gate voltage is higher than an ON voltage of the control signal corresponding to the ON status of the RF FET switch and the third pMOS gate voltage is lower than an OFF voltage of the control signal corresponding to the OFF status of the FET switch.

16. The method of claim 14, further comprising:
coupling a control circuit to a gate terminal of the nMOS transistor and to the gate terminal of the pMOS transistor, the control circuit comprising an edge-dependent pulse generator, and
based on the coupling, controlling time transitioning of voltages at the gate terminal of the nMOS transistor and at the gate terminal of the pMOS transistor via the edge-dependent pulse generator.

17. The method of claim 16, further comprising:
controlling, via the edge-dependent pulse generator,
time transitioning of voltage at a gate terminal of the nMOS transistor between the first nMOS gate voltage, the second nMOS gate voltage, and the third nMOS gate voltage; and
time transitioning of voltage at the gate terminal of the pMOS transistor between the first pMOS gate voltage, the second pMOS gate voltage, and the third pMOS gate voltage.

18. The method of claim 17, wherein the edge-dependent pulse generator is configured to generate a first pulse having a duration of the second portion of the first transition or the second portion of the second transition.

19. The method of claim 18, further comprising:
during the first transition, feeding the first pulse to a first level shifter; and
during the second transition, feeding the first pulse to a second level shifter.

20. The method of claim 19, further comprising:
via the first level shifter, shifting levels of the first pulse between the second nMOS gate voltage and the third nMOS gate voltage, thereby obtaining a first level shifted first pulse; and
via the second level shifter, shifting levels of the first pulse between the second pMOS gate voltage and the third pMOS gate voltage, thereby obtaining a second level shifted first pulse.

21. The method of claim 20, wherein the edge-dependent pulse generator is further configured to generate a second pulse having a duration of the first transition or the second transition.

22. The method of claim 21, further comprising:
during the first transition, feeding the second pulse and the first level shifted first pulse to a third level shifter; and
during the second transition, feeding the second pulse and the second level shifted first pulse to a fourth level shifter.

23. The method of claim 22, further comprising:
via the third level shifter, shifting levels of the second pulse between the first nMOS gate voltage, the second nMOS gate voltage, and the third nMOS gate voltage; and
via the fourth level shifter, shifting levels of the second pulse between the first pMOS gate voltage, the second pMOS gate voltage, and the third pMOS gate voltage.

24. The method of claim 1, wherein
the control signal is configured to transition from a first control voltage to a second control voltage higher than the first control voltage during a first portion of the first transition and to a third control voltage higher than the second control voltage during a second portion of the first transition following the first portion of the first transition; and
the control signal is configured to transition from a fourth control voltage to a fifth control voltage lower than the fourth control voltage during the first portion of the second transition and to a sixth control voltage lower than the fifth control voltage during a second portion of the second transition following the first portion of the second transition.

* * * * *